(12) United States Patent
Brown et al.

(10) Patent No.: US 12,248,034 B2
(45) Date of Patent: Mar. 11, 2025

(54) SERIES ARC DETECTION FIRMWARE

(71) Applicant: Aclara Technologies LLC, St. Louis, MO (US)

(72) Inventors: Scott David Brown, North Conway, NH (US); Curtis Whitmore Crittenden, Milbridge, ME (US); Richard B. Martyn, Jr., East Kingston, NH (US); Thomas Lee McDougall, Milton, NH (US); Lewis Fink, Sanford, ME (US); Charles Andrew Waters, Durham, NH (US)

(73) Assignee: Aclara Technologies LLC, St. Louis, MO (US)

( * ) Notice: Subject to any disclaimer, the term of this patent is extended or adjusted under 35 U.S.C. 154(b) by 80 days.

(21) Appl. No.: 18/137,952

(22) Filed: Apr. 21, 2023

(65) Prior Publication Data

US 2023/0341477 A1 Oct. 26, 2023

Related U.S. Application Data

(60) Provisional application No. 63/333,883, filed on Apr. 22, 2022.

(51) Int. Cl.
*G01R 31/66* (2020.01)
*G01R 22/06* (2006.01)
(Continued)

(52) U.S. Cl.
CPC .............. *G01R 31/66* (2020.01); *G01R 22/06* (2013.01); *G06N 3/04* (2013.01); *G06N 3/09* (2023.01)

(58) Field of Classification Search
CPC ........ G01R 31/66; G01R 22/06; G01R 31/52; G01R 11/04; G01R 35/00; G01R 22/065;
(Continued)

(56) References Cited

U.S. PATENT DOCUMENTS

2007/0058304 A1 3/2007 Parker et al.
2017/0025996 A1 1/2017 Cheung et al.
(Continued)

FOREIGN PATENT DOCUMENTS

CN 110716110 A 1/2020

OTHER PUBLICATIONS

PCT/US2023/019472 International Search Report and Written Opinion dated Jul. 26, 2023 (22 pages).

*Primary Examiner* — Jermele M Hollington
*Assistant Examiner* — Zannatul Ferdous
(74) *Attorney, Agent, or Firm* — Michael Best & Friedrich LLP

(57) ABSTRACT

A faulty meter socket detection system configured to detect faulty sockets as evidenced by series arcs in an input current waveform or an increased temperature of the meter is disclosed. The system includes a metering circuit configured to receive an input current waveform, and a controller including a power monitoring module. The meter may also include a temperature sensor. The power monitoring module is configured detect series arc currents input current waveform data by filtering the input current waveform data to produce filtered data, performing feature recognition on the filtered data, classifying the features of the filtered data, performing temporal processing on the filtered data, (optionally) scaling the temporal processing of the filtered data, and, scoring the input current waveform based on the temporal processing of the filtered data. The temperature sensor may detect an increased temperature of the meter, which may indicate a faulty socket.

20 Claims, 20 Drawing Sheets

(51) Int. Cl.
*G06N 3/04* (2023.01)
*G06N 3/09* (2023.01)

(58) Field of Classification Search
CPC .. G06N 3/04; G06N 3/09; G06N 3/08; G06N 3/048
See application file for complete search history.

(56) References Cited

U.S. PATENT DOCUMENTS

| | | | |
|---|---|---|---|
| 2017/0274419 A1* | 9/2017 | Frimpong | C09D 7/40 |
| 2018/0103302 A1* | 4/2018 | Bell | G06N 20/20 |
| 2019/0099101 A1* | 4/2019 | Ford | A61B 5/0042 |
| 2020/0011903 A1* | 1/2020 | Menzel | G06F 16/9035 |
| 2020/0328586 A1 | 10/2020 | Eriksen et al. | |
| 2020/0366079 A1 | 11/2020 | Telefus et al. | |

* cited by examiner

SERIES ARC DETECTION FIRMWARE

RELATED APPLICATIONS

This application claims the benefit of U.S. Provisional Patent Application No. 63/333,883, filed Apr. 22, 2022, the entire contents of which are hereby incorporated by reference.

FIELD

The embodiments disclosed herein relate to methods and products for determining electrical socket integrity.

SUMMARY

Meters connected to power distribution networks can have faulty sockets. The long-term effects of faulty sockets can be electrical socket failure, electrical failure, or even fire. Two of the causes of faulty sockets are electrical arcs and high temperatures. Electrical arcs across a faulty connection between a power network and a load can occur if there is a connection failure to a connected load. Electrical arcs occurring in a series can be referred to as series arcs. Series arc faults are difficult to detect as they generally do not cause current to flow through a ground or neutral conductor. However, detecting these series arcs can help identify faulty sockets. High temperatures can lead to de-soldering, the connection issues mentioned above, and other connection issues. As with series arcs, detecting high temperatures in a meter can help identify faulty sockets.

In some embodiments, a series arc detection system is configured to detect series arcs in an input current waveform. The series arc detection system includes a metering circuit configured to receive an input current waveform and a controller including a power monitoring module configured detect series arc currents input current waveform. The controller detects series arc currents by: filtering the input current waveform data to produce filtered waveform; performing feature recognition on the filtered waveform; classifying the features of the filtered waveform; performing temporal processing on the filtered waveform; producing a score for the input current waveform based on the integration of the filtered waveform; and, reporting the score to a user based on a comparison of the score to a programmable threshold.

In some embodiments, a method of determining socket integrity includes receiving, via a metering circuit, an input current waveform and detecting, via a controller including a power monitoring module, series arc currents in the input current waveform by: filtering the input current waveform to produce a filtered waveform; performing feature recognition on the filtered waveform; classifying the features of the filtered waveform; performing temporal processing on the filtered waveform; producing a score for the input current waveform based on the integration of the filtered waveform; and, reporting the score to a user based on a comparison of the score to a programmable threshold.

In some embodiments, a meter in a power distribution network includes a metering circuit in communication with at least one temperature sensor and configured to receive an input current waveform and determine a temperature of the meter. The meter is also in communication with a controller including a power monitoring module configured detect series arc currents input current waveform by: filtering the input current waveform data to produce filtered waveform; using a root mean squared function on the input current waveform to produce an root-mean-squared (RMS) value; performing feature recognition on the filtered waveform; classifying the features of the filtered waveform; performing temporal processing on the filtered waveform; producing a score for the input current waveform based on the integration of the filtered waveform; determining the temperature value for the meter; using a fuzzy inference classifier to determine an alarm score based on the score for the input current waveform, the RMS value, and the temperature value for the meter; and, reporting the alarm score to a user based on a comparison of the score to a programmable threshold.

Other aspects of the technology will become apparent by consideration of the detailed description and accompanying drawings.

DETAILED DESCRIPTION

Before any embodiments of the application are explained in detail, it is to be understood that the application is not limited in its application to the details of construction and the arrangement of components set forth in the following description or illustrated in the following drawings. The application is capable of other embodiments and of being practiced or of being carried out in various ways.

Also, it is to be understood that the phraseology and terminology used herein are for the purpose of description and should not be regarded as limiting. The use of "including," "comprising," or "having" and variations thereof are meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. As used within this document, the word "or" may mean inclusive or. As a non-limiting example, if it we stated in this document that "item Z may comprise element A or B," this may be interpreted to disclose an item Z comprising only element A, an item Z comprising only element B, as well as an item Z comprising elements A and B.

A plurality of hardware and software-based devices, as well as a plurality of different structural components may be used to implement various embodiments. In addition, embodiments may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic based aspects of the invention may be implemented in software (for example, stored on non-transitory computer-readable medium) executable by one or more processors. For example, "control units" and "controllers" described in the specification can include one or more electronic processors, one or more memory modules including non-transitory computer-readable medium, one or more input/output interfaces (I/O interfaces), one or more application specific integrated circuits (ASICs), and various connections (for example, a system bus) connecting the various components.

Figure 1:
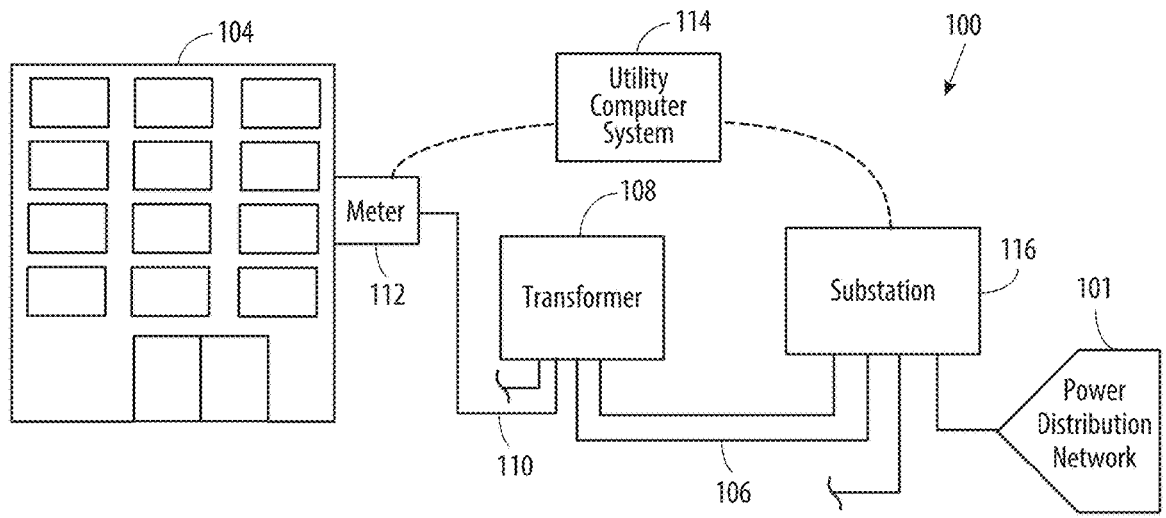
FIG. 1 illustrates a power distribution system including a power distribution network connected to a meter of a metered structure.

FIG. 1 illustrates a power distribution system 100 including a power distribution network 101 connected to a meter 112 of a metered structure 104. The power distribution system 100 includes one or more power distribution lines 106, a step-down transformer 108, and a power feeder line 110. The power feeder line 110 supplies alternating current (AC) power to a metered structure 104, via a power meter 112. It is contemplated that metered structure 104 may be a residential, commercial, and/or industrial structure. As shown in FIG. 1, the meter 112 is coupled to the power feeder line 110 and is configured to monitor parameters of the power supplied from the power distribution lines 106 (which in turn is provided by a utility, such as a fossil fuel-based power plant, a nuclear power plant, wind turbines, solar collectors, etc.). Parameters can include energy usage, power factor, voltage levels, current levels, etc.

In some embodiments, the meter 112 may be configured to communicate with one or more utility computer systems 114. The utility computer system 114 may be a collection device used to communicate with multiple meters 112 in an area to collect data related to energy usage for one or more metered structures 104 and may be in wired or wireless communication with a substation 116 of the utility. In some embodiments, the meter 112 may communicate with the utility computer system 114 via a wireless connection, such as RF (e.g., cellular or other RF communication type). However, other communication protocols are contemplated and will be described in more detail below. In other examples, the meter 112 may communicate with the utility computer system 114 via a wired connection, such as, but not limited to, powerline communication, fiber optic communication or internet communication. In some examples, the utility computer system 114 is a portable system operated by one or more utility personnel, who move the utility computer system 114 to be within range of one or more meters 112 in a given area, thereby allowing for communication to be established between the meter 112 and the utility computer system 114. In other examples, the utility computer system 114 may be a fixed system or may have multiple fixed receivers across a utility distribution area to allow for communication to be conducted between the meter 112 and the utility computer system 114.

Figure 2:
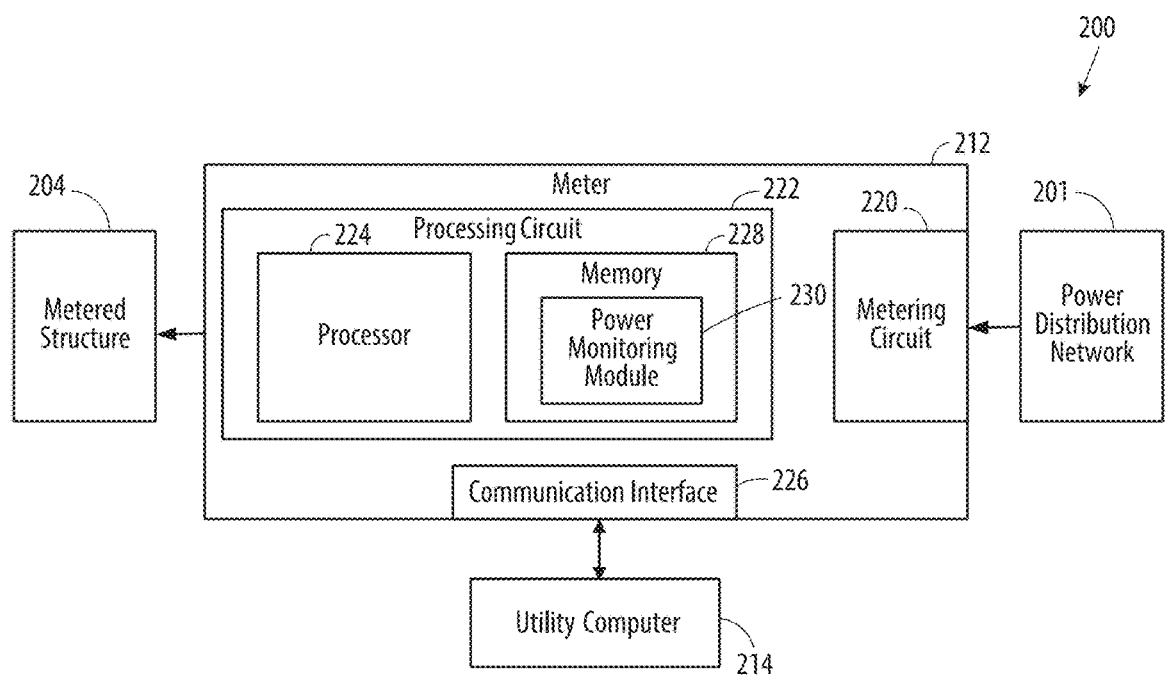
FIG. 2 illustrates a block diagram of a metering system.

Turning now to FIG. 2, a block diagram of a metering system 200 is shown, according to some embodiments. In one embodiment, the metering system 200 is similar to the meter 112 described above in regard to FIG. 1. The metering system 200 may include a meter 212 and a communication module interface 226. The meter 212 may include a processing circuit 222, a metering circuit 220, and a communication module interface 226. The processing circuit 222 may include one or more electronic processors 224 and one or more memory devices 228. The processing circuit 222 may be communicably connected to one or more of the processing circuit 222 and the communication module interface 226. The electronic processor 224 may be implemented as a programmable microprocessor, an application specific integrated circuit (ASIC), one or more field programmable gate arrays (FPGA), a group of processing components, or with other suitable electronic processing components.

The metering circuit 220 may be configured to meter the current drawn by the metered structure 204. The metering circuit 220 may also be configured to produce waveform data modelling the input current. This waveform data may be referred to as the "input current waveform" herein and may be directly associated with the input current waveform received at the meter 212 from the power distribution network 201.

The memory 228 (for example, a non-transitory, computer-readable medium) includes one or more devices (for example, RAM, ROM, flash memory, hard disk storage, etc.) for storing data and/or computer code for completing or facilitating the various processes layers and modules described herein. The memory 228 may include database components, object code components, script components, or other types of code and information for supporting the various activities and information structure described in the present application. According to one example, the memory 228 is communicably connected to the electronic processor 224 via the processing circuit 222 and may include computer code for executing (for example, by the processing circuit 222 and/or the electronic processor 224) one or more processes described herein.

The processing circuit 222 is configured to be coupled to at least a portion of the utility power that is associated with the metering system 200. The processing circuit 222 may be configured to execute modules stored in the memory 228. In one embodiment, the processing circuit 222 is configured to provide the measured data to a power monitoring module 230 within the memory 228. The power monitoring module 230 is configured to determine one or more parameters associated with the utility power monitored by the processing circuit 222. For example, the power monitoring module 230 may determine power usage (e.g., kW, kWh, VAR, VA, etc.) based on the data measured by the processing circuit 222. In other examples, the power monitoring module 230 may be configured to determine other parameters, such as power factor, phasor data, phase balance, and other applicable parameters. As will be described in further detail below, the power monitoring module may also be configured to detect electrical socket integrity issues (e.g., series electrical arcs) caused by loose connections between the meter 212 and the power distribution network 201, oxidized contacts, foreign material interfering with the connection, differences in the contact material between the feeder line 110 and the power distribution network 201, etc., and high meter temperatures tending to indicate a faulty socket.

The communication interface 226 is configured to provide communication between the meter 212 and external devices, such as utility computers 214. In the embodiment shown, the communication interface 226 is be disposed inside a housing of the meter 212. In other embodiments, the communication interface 226 is external to the housing of the meter 212 and is in communication with the meter 212 via a wired or wireless connection.

In some examples, the communication interface 226 may support various modes of communication, such as RF, Bluetooth, cellular (e.g., 3G, 4G, 5G, CDMA, etc.), RF, Wi-Fi, NFC, powerline communications (e.g., TWACS, PRIME, etc.) and the like. The communication interface 226 may be or include wireless communication interfaces (for example, antennas, transmitters, receivers, transceivers, etc.) for conducting data communications between the meter 212 and the utility computer system 214. Additionally, the communication interface 226 may use communication protocols such as cellular (3G, 4G, 5G, LTE, CDMA, etc.), Wi-Fi, LoRa, LoRaWAN, Z-wave, Thread, powerline communication, short hop radio, and/or any other applicable wireless communication protocol.

Figure 3:
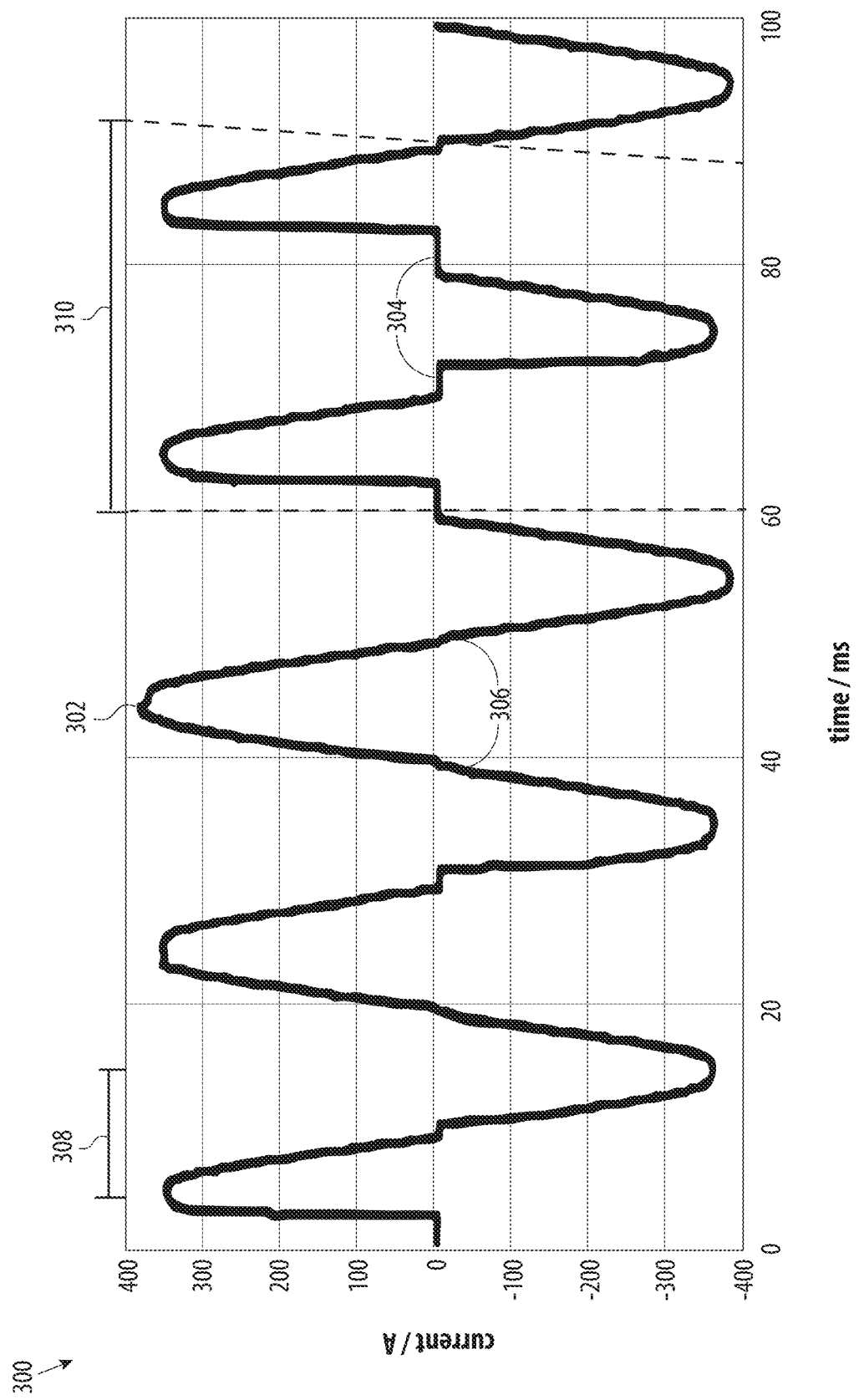
FIG. 3 illustrates a plot of an input current waveform of an arcing AC signal received at a meter from the power distribution network.

FIG. 3 depicts a plot 300 of an input current waveform 302 of an arcing AC signal received at a meter 212 from the power distribution network 201. The power provided by the power distribution network 201 to the meter 212 may be an AC signal having a frequency of 16 KHz or under. As shown in FIG. 3, waveform 302 is an AC signal containing electrical arc currents. Electrical arc currents may occur if a connection between the meter 212 and the power distribution network 201 is faulty, such that charge builds up across an insulator (e.g., air) disposed between the relevant conductor of the meter and the relevant conductor of the power distribution network 201 until an electrical arc results. Specifically, the AC signal may begin to cause electrical arcs over the faulty connection. Faulty connections may include loose connections between the meter 212 and the power distribution network 201, oxidized contacts, foreign material interfering with the connection, differences in the contact material between the feeder line 110 and the power distribution network 201. These electrical arcs may be identified in the input current waveform 302 of the AC signal in the form of "shoulders" 304 (e.g., a zero-current period preceded by a rapid increase in current or followed by a rapid increase in current, sometimes both) at the zero crossing 306 every half-cycle 308.

The shape of the input current waveform 302 may depend on factors such as arc gap size, load impedance (e.g., impedance of the meter), faulty connection, electrical contact oxidation levels, and faulty connection temperature. These factors may especially affect the input current waveform 302 in the areas around the zero-crossings. Oxidation of the connection surface may produce zero-current periods in the input current waveform 302, resulting in a flat input current waveform 302. Specifically, the higher the oxidation levels, the more voltage required for to generate an electrical arc. Large arc gap sizes also result in zero-current periods in current received by the meter 212. An increase in inductive load impedance may reduce the zero-current shoulder size. Variances in gap temperature may influence the voltage required to produce an electrical arc. In some cases, due to increases in temperature at the faulty connection, molten copper can form a bridge across the faulty connection thereby creating a condition where current flow is not interrupted, and electrical arcing is therefore abated. For example, in FIG. 3 arcing stops between 38 ms and 48 ms, perhaps indicating that a conducting bridge was temporarily formed by molten metal.

In general, the flat portions in the current waveform at the zero-crossings 306 may not be consistent in size or appearance for all half cycles during a series arc fault. In addition to flat portions at the zero-crossings 306, the input current waveform 302 may also exhibit steep current edges immediately following the zero-current area of the input current waveform 302. The steepness of these edges may depend on the length of the current gap and load impedance.

Analyzing the input current waveform 302 of an AC signal for these and other features can help identify arc currents in an input current waveform and thereby help prevent fires or other dangerous situations that might result from arcs in the current signal. Accordingly, in some embodiments, the power monitoring module 230 may first gate and filter the input current waveform 302, then perform feature recognition on the filtered waveform (in some cases including pulse train detection), scale the recognized features, classify the features of the filtered waveform, perform temporal integration on the classified features, take additional considerations into account, and produce an arc score by scoring the input current waveform 302 based on the integrated features and the additional considerations.

Figure 4:
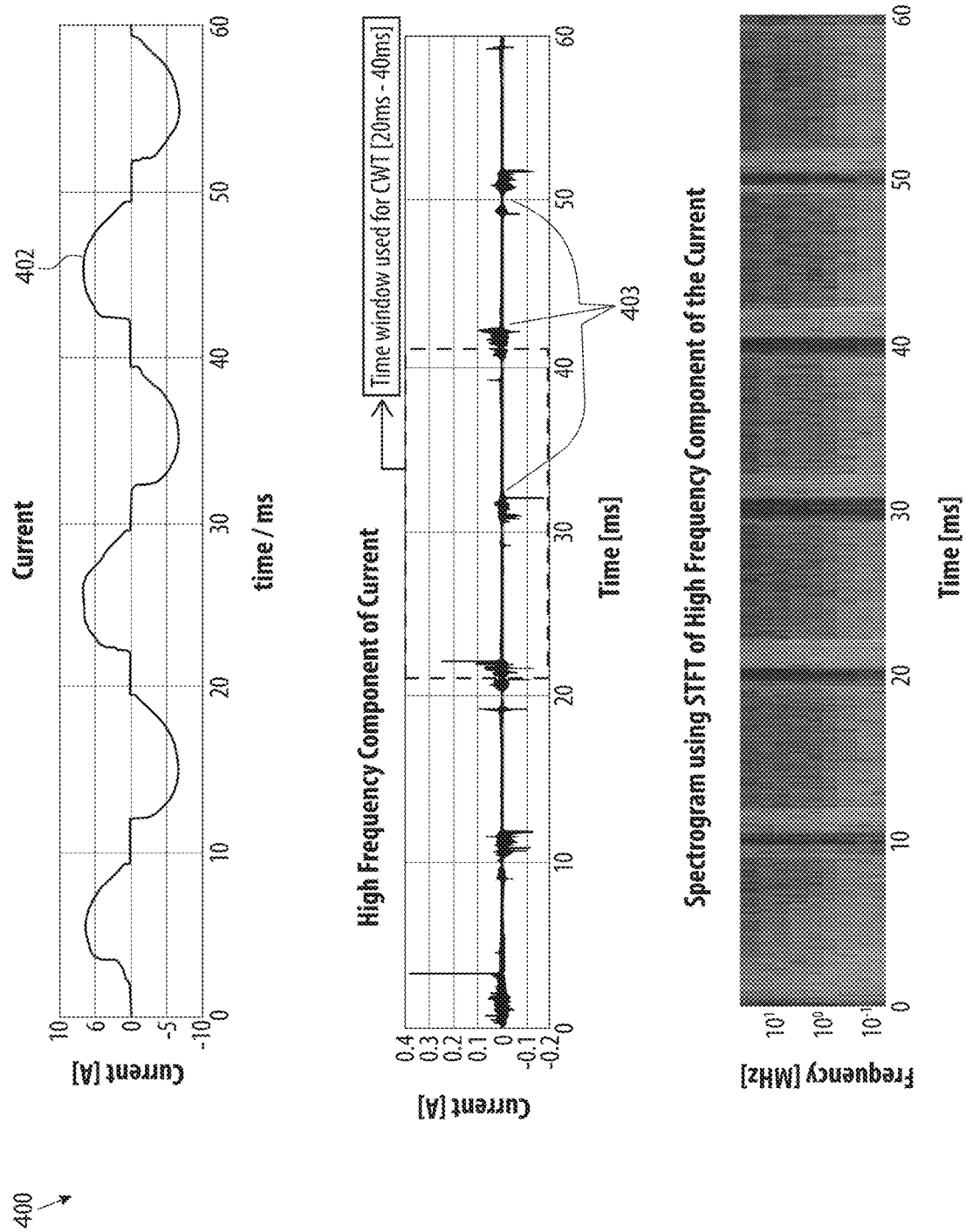
FIG. 4 illustrates a correlation of a current waveform of an arcing AC power signal received at a meter from a power distribution network to a high frequency component of the AC power signal.

FIG. 4 depicts a correlation 400 of a current waveform 402 of an arcing AC power signal received at a meter 212 from the power distribution network 201 to a high frequency (HF) component 403 of the AC power signal. It can be seen in FIG. 4 that each time a shoulder appears in the current waveform 402, a high-frequency component of the current appears. This high-frequency component of the current waveform 402 can be obtained by applying filters to the current waveform 402. Other components or forms of the current waveform 402 can also be obtained by filtering the current waveform 402. The nature of the series arc fault current data suggests that high frequency content of the signal is short lived and exists only at specific times during the signal. The filtering operation used for highlighting such high frequency content may be configured to capture both the frequency and time content of the arc fault signature. A single filter having an ideal impulse response and frequency response may is useful to highlight the target high frequency signal with a balance of time and frequency characteristics. The process of filtering the input current waveform 302 will be described below.

Figure 5:
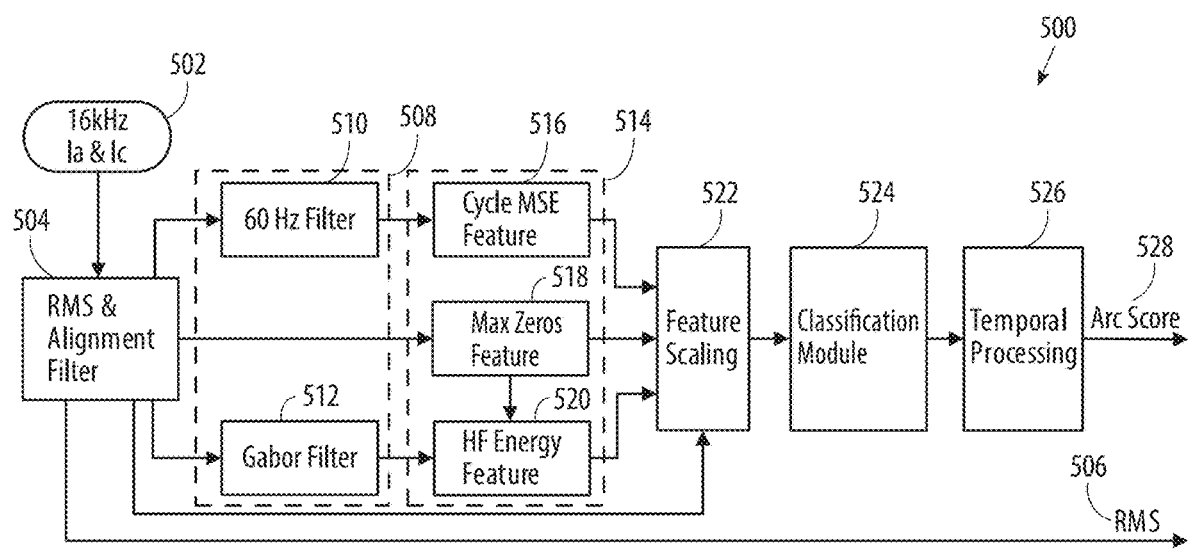
FIG. 5 illustrates a diagram of a system configured to detect series arcing occurring on a connection between a meter and a power distribution network.

FIG. 5 shows a diagram 500 of a system configured to detect that a socket of a meter 212 is faulty by identifying series arcing occurring on a connection between a meter 212 and a power distribution network 201. In the embodiment shown, a root-mean-square (RMS) filter 502 is used for the initial filtering of the input current waveform 302. The RMS filter 504 may be used eliminate non-arcing current waveforms from further filtering analysis. For example, the RMS filter 504 may obtain a root-mean-square for the input current waveform 302 as an initial step, to rule out the possibility that the input current waveform 302 contains evidence of series current arcs. The RMS filter 504 may also be configured to flag or disqualify input current waveforms 302 where arcing is not possible (e.g., a zero-current input) or in situations where the classification module 524 is likely to misclassify the input current waveform 302 after filtering to avoid the potential of producing false positive results (e.g., detecting a socket as faulty when, in reality, the socket is not faulty). For example, the classification module 524 may be likely to misclassify the input current waveform 302 if an RMS value of the input current waveform 302 is below some threshold (e.g., below 1-6 amps, etc.), or if a first RMS current cycle of the input current waveform 302 is significantly different than a second RMS current cycle of the input current waveform 302. A delta RMS value may be compared to an RMS threshold to filter out featureless 2-cycle portions of the input current waveform 302 before feature extraction. This comparison may be expressed as:

$$\Delta RMS = \frac{|RMS_{c1} - RMS_{c2}|}{MAX(RMS_{c1}, RMS_{c2})} < T_{\Delta RMS}$$

Where $RMS_{c1}$ is the first cycle of the 2-cycle portion, $RMS_{c2}$ is a second cycle of the 2-cycle portion, and $T_{\Delta RMS}$ is the RMS threshold.

In the diagram shown, an alignment filter is also used in conjunction with the RMS filter 504. The alignment filter is configured to filter out features not occurring at zero-crossings of the input current waveform 302.

Following the RMS filter 504, an additional filtering module 508 applies additional filters to the RMS filtered input current waveform 302. In some embodiments, a relatively simple 60 Hz filter 510 is used to remove noise from the input current waveform 302 to remove noise in anticipation of feature extraction. In such embodiments, a high-pass, band-pass, or notch filter may be used to remove portions of the input current waveform around or below 60 Hz.

In some embodiments, a Gabor filter 512 is used to extract the target high frequency signal with a desirable balance of time/frequency characteristics. A Time-Bandwidth product (TBW) is the product of the time variance and frequency variance and is a measure of localization in time and frequency domains simultaneously. A Gaussian function has a desirable TBW Further, the Fourier transform of a Gaussian is also Gaussian, the transform pair can be expressed as:

$$f(t) = \frac{1}{\sqrt{2\pi\sigma^2}} e^{-\frac{t^2}{2\sigma^2}}, G(f) = e^{-2(\pi\sigma f)^2}$$

The impulse response of the Gabor filter 512 is defined as a complex sinusoid multiplied by a Gaussian function.

$$f(t) = \frac{1}{\sqrt{2\pi\sigma^2}} e^{-\frac{t^2}{2\sigma^2}} * e^{j2\pi F_0 t}$$

Thus, the impulse response of a Gabor filter 512 is effectively a gaussian window modulated to frequency $F_0$—a band-pass filter with a center frequency $W_0$ and bandwidth determined by $\sigma$. This type of filter has a desirably compact representation in both time and frequency. The output of the Gabor filter 512 may be windowed to a two-cycle window using a Maximum Contiguous Zeros function which may be expressed as:

$$\text{hf\_energy} = \text{Max}\left(\sum_t f(t)^2 * \text{mask}(t)\right)$$

Following the use of the 60 Hz filter 510 or the Gabor filter 512, feature extraction is performed on the gated filtered input current waveform 302. A feature extractor 514 uses filters and functions to extract (e.g., isolate) features from the input current waveform 302, and the extracted features are optionally scaled by a scaling module 522 so that the features can be classified as indicative of series electrical arcs by a classification module 524 based on a classification threshold. Output of the classification module 524 is then temporally processed (e.g., integrated using a leaky integrator) by a temporal processing module 526 to produce an arc score at the scoring module 528. In some embodiments, feature extraction is performed on two contiguous cycles of current data. In some embodiments, feature extraction is performed on multiple current channels (e.g., Ia and Ic in some meters). At the output of the additional filtering module 508, a feature extraction module 514 extracts features indicative of arcing currents.

In some embodiments, at the output of the 60 Hz filter 510, a Normalized Mean Squared Error (NMSE) function 516 measures the difference between the $1^{st}$ cycle 312 and $2^{nd}$ cycle 314 in the 2-cycle window of data 316. The NMSE function 516 may be used to detect the signal randomness caused by series arcing. At the input of the NMSE function 516, a high-pass filter, may be used to suppress the fundamental frequency (e.g., 60 Hz in North America, 50 Hz in Europe) of the input current waveform 302. In some embodiments, a high-pass infinite impulse response filter or a high-pass finite impulse response filter, may be used as the aforementioned high-pass filter. In some embodiments, the cutoff frequency of the high-pass filter may be between 60 Hz and 120 Hz or 50 Hz to 100 Hz but is not limited to these ranges and may include other frequencies or ranges.

The output of the HP Filter may be processed using the NMSE function 516. The function 516 can be expressed as:

$$NMSE = \frac{\sum_j (x_j - x_{j+k})^2}{0.5 * \sum_{j+k} (x_{j+k})^2}$$

Where $x_j - x_{j+k}$ is the previous cycle and $x_{j+k}$ is the present cycle. Typically, a correlation coefficient is normalized by the number of points in the window of interest. For the purposes of analyzing a 2-cycle window of the input current waveform 302, the denominator may therefore be scaled by 0.5.

In some embodiments, at the output of the Gabor filter 512, a High Frequency Energy 520 detects the electrical arc characteristic of high frequencies (e.g., frequencies around 2500 Hz) at zero-crossings of the input current waveform 302 by use of a high-pass filter centered at around 2500 Hz, and a windowing procedure on the output of the Gabor filter 512.

Additionally, in some embodiments, neither the 60 Hz filter 510 nor the Gabor filter 512 are used, and instead a Maximum Contiguous Zeros function 518 measures the number of points in the input current waveform 302 that are contiguous and below a dynamic threshold 318 (e.g., below zero) and can be used to detect the current shoulder at the zero crossing. The zeros count is incremented if a point's absolute value is below a threshold and the absolute value of a point previous to that point was also below the threshold. The string of contiguous zeros breaks if a contiguous point rises above the dynamic threshold. A zeros count is created and incremented if the contiguous zeros condition resumes later in the aforementioned 2-cycle window of data 310. The result of this process may be one or more zeros counts. The maximum contiguous zeros function can be expressed as:

$$C\_Zeros = \sum_L (|x_L| < T_z) \text{ And } (|x_{L-1}| < T_z)$$

$$Zeros = MAX \sum C\_Zeros$$

Where the dynamic threshold is expressed as $T_z$, $|x_L|$ is the point currently being considered, and $|x_{L-1}|$ is the previous point. In some embodiments, $T_z = \alpha * RMS$, where $\alpha \approx 0.03$ to 0.08. The maximum count of contiguous zeros over the 2-cycle window is identified within the one or more zeros counts. In some embodiments, the Maximum Contiguous Zeros function 518 is used in conjunction with the High Frequency Energy function 520 to perform feature extraction before (optional) scaling by a scaling module 522, classification by a classification module 524, and temporal processing by the temporal processing module 526.

Figure 6:
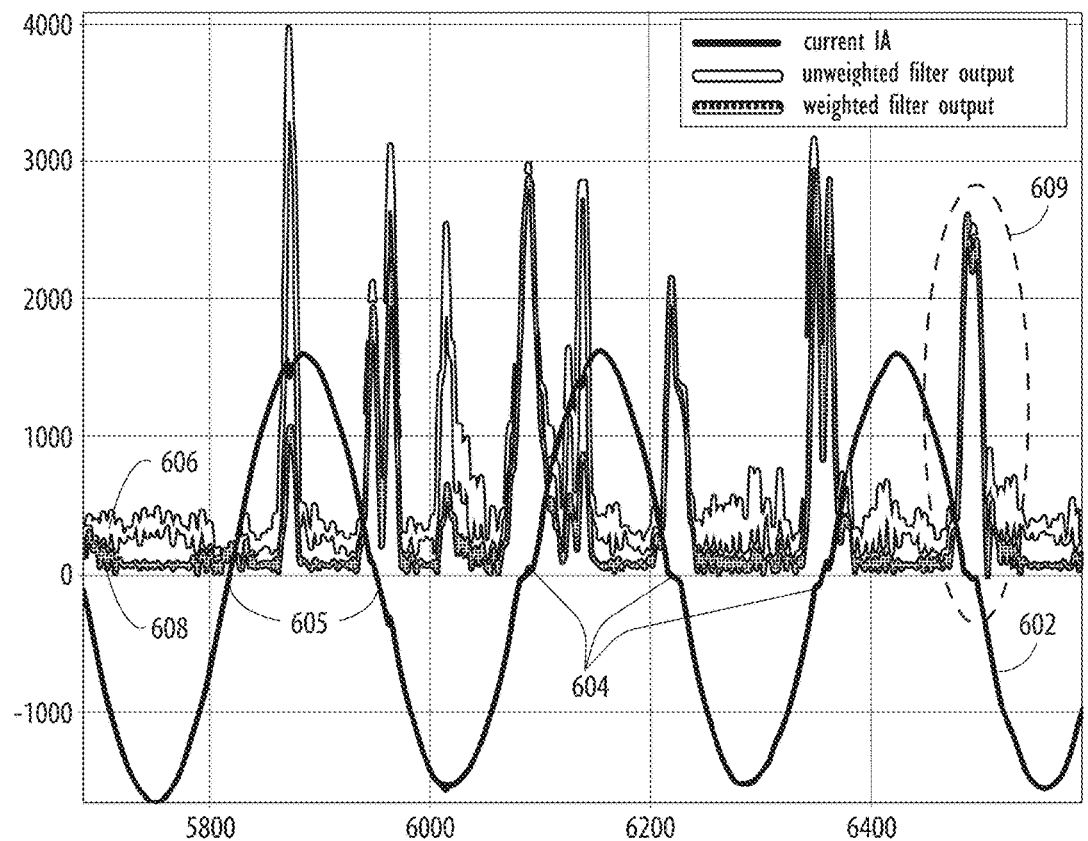
FIG. 6 illustrates an input current waveform including a series of shoulders at the zero-crossings of the input current waveform.

FIG. 6 depicts an input current waveform 602 including a series of shoulders 604 at the zero-crossings 605 of the input current waveform 602, indicating a series of electronic arcs between a meter 112 and a feeder line 110. A filtered, scaled version of the input current waveform 602 is shown overlayed on an unscaled filtered version of the input current waveform 602 during the same time span. It can be seen in FIG. 6 that spikes 610 in the unscaled filtered version of the input current waveform 602 correspond to the shoulders 604 of the input current waveform 602. Both the unscaled filtered version of the input current waveform 602 and the scaled filtered version of the input current waveform 602 contain extracted features 609. In FIG. 6, the scaled filtered version of the input current waveform 602 is relatively flat in between shoulders 604. This is due to good filter design. Specifically, the filter used in the embodiment shown is designed to isolate the time instance of high frequency content input current waveform 602. In the embodiment shown, the filter is designed respond best to wideband events (1-4 kHz) by ensuring that peak filter response occurs at zero-crossings 605. However, if the filter design is not robust enough, any discontinuity in the waveform might result in an unsuppressed filter output. In the example shown, the filter produces a suppressed output when the input current waveform 602 is not at a zero crossing and produces an unsuppressed filter output near the zero-crossings 605 of the input current waveform 602. This is desirable for feature extraction, as described above, and for subsequent (optional) feature scaling by the scaling module 522 before classification at the classification module 524.

In some embodiments, a Normalization function is also used prior to classification. The normalization coefficients may be computed using only the feature data extracted from non-arcing waveforms. The feature data may then be normalized to create a feature data set with unit variance and a standard deviation of 1.0. The normalization coefficients are then applied to the feature data set. This application of the normalization coefficients creates a non-arcing dataset with a symmetrical shape in the feature space.

Figure 7:
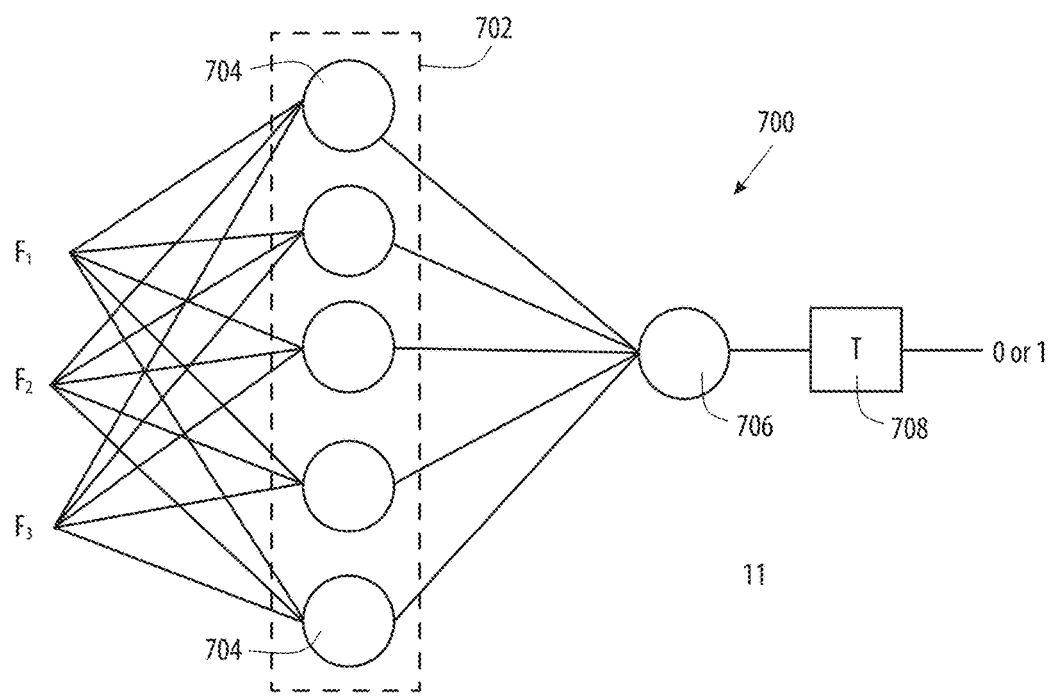
FIG. 7 illustrates a classification module in the form of a multi-layer perceptron neural network.

In reference to FIG. 7, an embodiment of the classification module 524 in the form of a multi-layer perceptron neural network 700 configured to classify the features extracted from an input current waveform 602 is shown. The multi-layer perceptron shown includes a plurality of inputs provided feature by extraction functions F1, F2, and F3. A hidden layer 702 includes a node for each feature extraction function F1, F2, F3 (e.g., 3 nodes, in this example) and 2 additional nodes 704 to act as additional, unique neurons. However, the number of feature extraction functions may vary, as well as the additional nodes. For example, if features are extracted using both Normalized Mean Squared Error and High Frequency Energy functions 516, 520, the multi-layer perceptron may include 6 nodes, 2 nodes corresponding to the feature extraction inputs and 4 nodes acting as additional neurons. In the embodiment shown, the multi-layer perceptron neural network 700 also includes a single output node 706 and a back propagation training function 708 trained on the output of the multi-layer perceptron neural network 700 and test data. In some embodiments, the nodes of the hidden layer 702 act as a plurality of unique neurons in that the hidden layer 702 may be configured to analyze the input according to a classification threshold (e.g., an activation threshold) which may directly affect how likely the hidden layer 702 is to classify a given feature as evidence of an arc current. The multi-layer perceptron neural network 700 may be trained on output feedback produced by a training function 708. The training function 708 may be configured to compare the output of the multi-layer perceptron neural network 700 to verified test data.

Test data provided for training the multi-layer perceptron neural network 700 may be UL1699 test data, lab-generated test data (e.g., hot socket simulator data, or other test circuit data), or simulated data. A performance metric, such as an F1 score or Mathews Correlation Coefficient (MCC) may be calculated based on the classification output of the multi-layer perceptron neural network 700 and the test data. In some embodiments, the stringency of the classification module 524 may be automatically modified based on the MCC or F1 Score by adjusting the aforementioned classification threshold. For example, in training the multi-layer perceptron neural network 700, the training function 708 may adjust the classification threshold over a range of values to determine a threshold value that maximizes the MCC or F1 score. In some embodiments, the classification threshold may be adjusted based on user input. The output of the classification module 524 (e.g., the perceptron neural network 700) may be temporally processed (e.g., integrated over time) and scaled to produce an arc score at the scoring module 528 (e.g., a confidence score) indicating a confidence that the input current waveform data 602 contains evidence of series arc currents.

Figure 8:
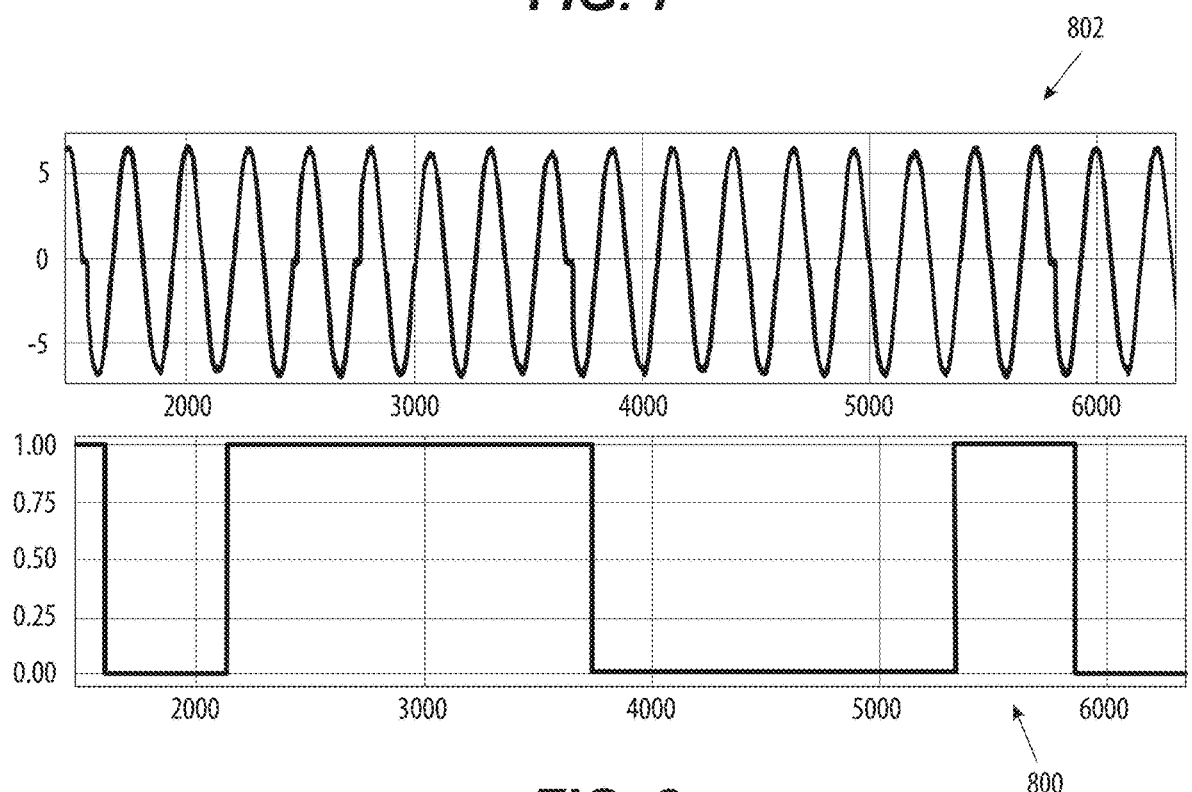
FIG. 8 illustrates the output of a multi-layer perceptron neural network.

As shown in FIG. 8, the output of the multi-layer perceptron neural network 700 may be a classification in the form of a square waveform 800 having a value of 1 during 2-cycle periods of the input current waveform 802 that the multi-layer perceptron neural network 700 classified as containing an electrical arc current, and a waveform 800 having a value of 0 during 2-cycle periods that the multi-layer perceptron neural network 700 classified as not containing an electrical arc current. However, it is contemplated that, in some embodiments, these classification values could be reversed.

Figure 9:
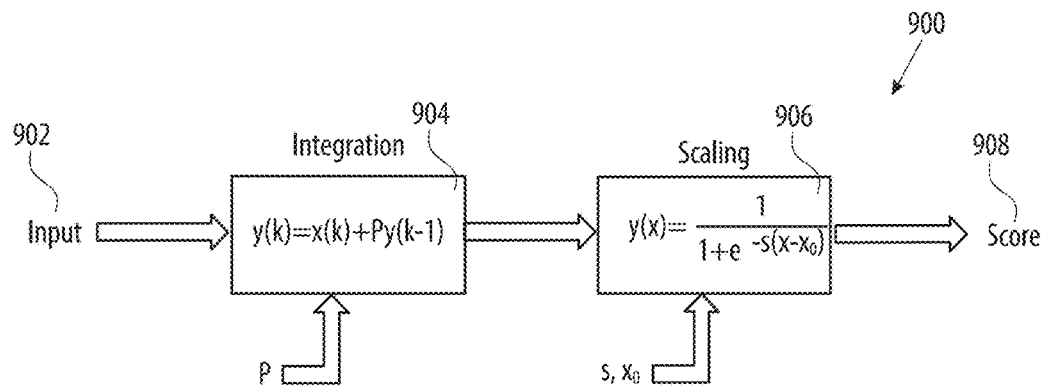
FIG. 9 illustrates a flowchart of an embodiment in which an output of a classification module is temporally processed as input by a temporal processing module.

FIG. 9 shows a flowchart 900 of an embodiment in which the output of the classification module 524 is temporally processed as input 902 by a temporal processing module 904. The temporal processing module 904 configured to integrate the output of the classification module 524 according to the expression:

$$y(k) = x(k) + Py(k-1)$$
$$\frac{dy}{dt} = -Py(t) + x(t)$$
$$y(t) = ke^{-Pt}$$

where P is a leaky integrator decay parameter. The integrator is configured to produce a decay in output when input from the classification module 524 is equal to 0 (e.g., when the classification module 524 is not outputting a positive classification pulse). In the embodiment shown, the value of P can be adjusted based on input (e.g., user input). As will be discussed further below, the temporal processing module output may, in some embodiments, be scaled by a scaling function 906, and output as an arc score 908.

Figure 10:
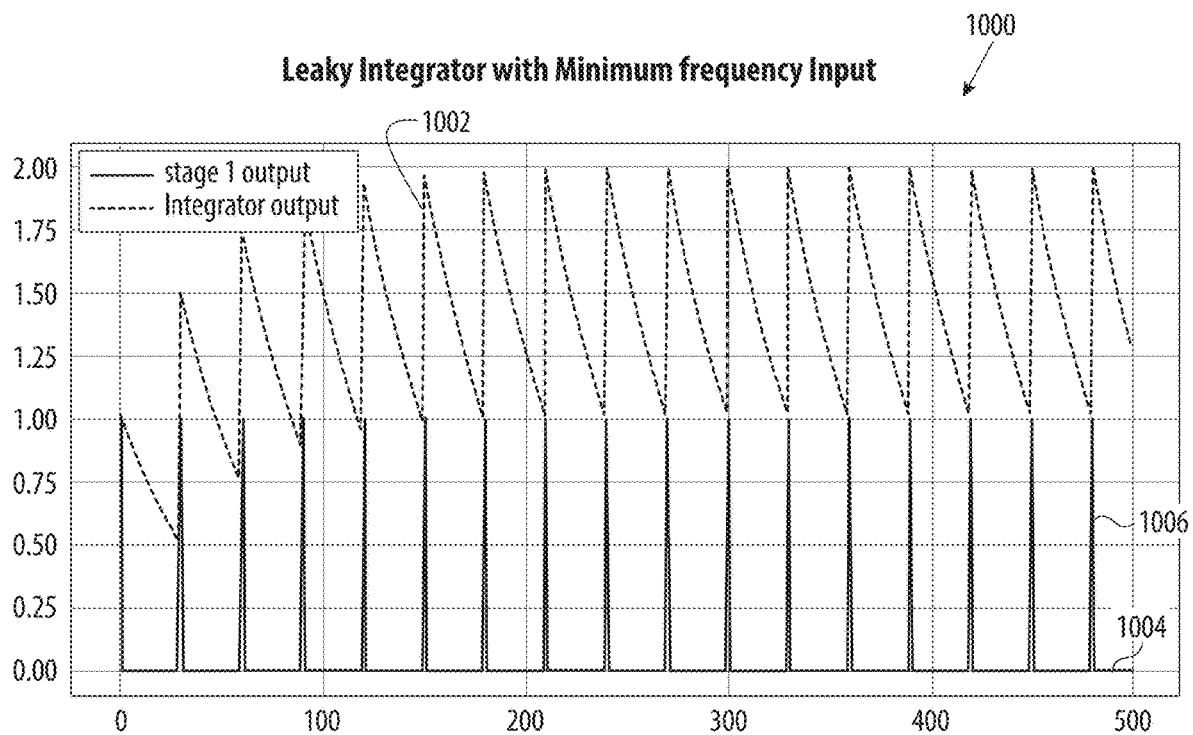
FIG. 10 illustrates a plot of temporal processing module output as a result of a temporal processing module operating in response to an output of a classification module.

FIG. 10 shows a plot 1000 of temporal processing module output 1002 as a result of the temporal processing module 904 operating in response to the output of the classification module 1004 according to the formula above. In the embodiment shown, the temporal processing module output 1002 value exponentially decreases by half before each new pulse 1006 is received, meaning that, for FIG. 10, $e^{-Pt}$ is chosen to equal 0.5. The decay parameter may not be so easily related to the per time decay of temporal processing module output 1002, at least in part because the 2-cycle sampling period may not be squarely 1 second. The decay parameter P may expressed:

$$P = \frac{-\ln(e^{-Pt})}{t_{sec}}$$

where $t_{sec}$ is the 2-cycle sampling period. The decay parameter P may be adjustable by user input and enable a user to set a minimum acceptable arc current detection rate. However, it can be determined from the Z-transform of the leaky integrator function that, for stability, $e^{-PT}$ should be less than 1:

$$\frac{Y(Z)}{X(Z)} = \frac{1}{1 - e^{-PT}Z^{-1}}$$

Once per second, a pulse 1006 indicating a positive classification of an input waveform 802 is output from the classification module 524, indicating that once per second a 2-cycle window (i.e., every 60 cycles of AC power, or every 30 samples, in the embodiment shown) 310 of an input current waveform 802 is classified as containing evidence of an arc current. The temporal processing module output decays by one half for every second that passes, meaning that the chosen P is:

$$P = \frac{-\ln(0.5)}{t_{sec}} = 0.693$$

It should be noted that the sampling rate may be adjustable by a user changing the decay rate P according to the equation above.

Figure 11:
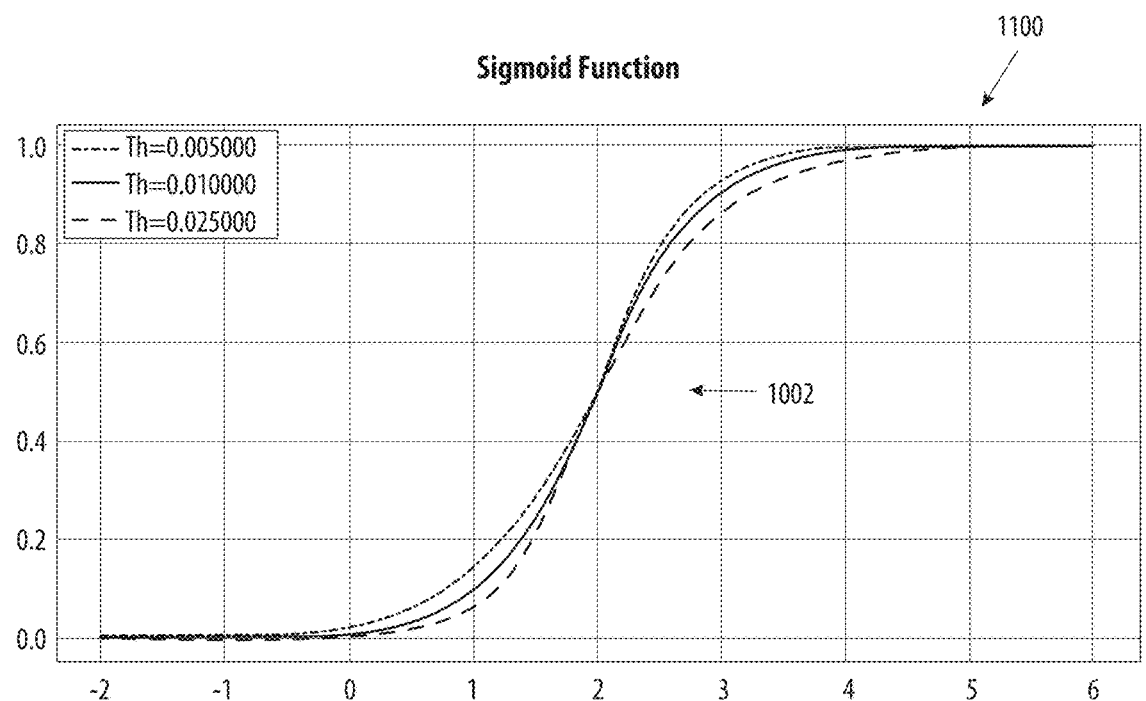
FIG. 11 illustrates a plot of a sigmoid function configured to scale the output of the temporal processing module.

FIG. 11 shows a plot 1100 of a sigmoid function 1102 configured to scale the output of the temporal processing module 904. In the embodiment shown, the sigmoid function 1102 is configured to scale temporal processing module output 1002 to a value between 0 and 1. The scaled temporal processing module output 1002 is the scaled arc score 908. The scaled arc score 908 indicates a confidence that the input current waveform data 802 includes evidence of series arcing currents. A sigmoid can be expressed as:

$$s(x) = \frac{1}{1 + e^{-kx}}$$

The sigmoid shown in FIG. 11 can be expressed as:

$$s(0) = \frac{1}{1 + e^{-k(-2)}} <= T_h$$

The slope of the sigmoid function 1102 can be expressed as:

$$k = \frac{(\ln(1 - T_h) - \ln(T_h))}{t_0}$$

Where s is the sigmoid scale factor, to is the sigmoid offset, and $T_h$ is the value of the temporal processing module output to be scaled.

Figure 12:
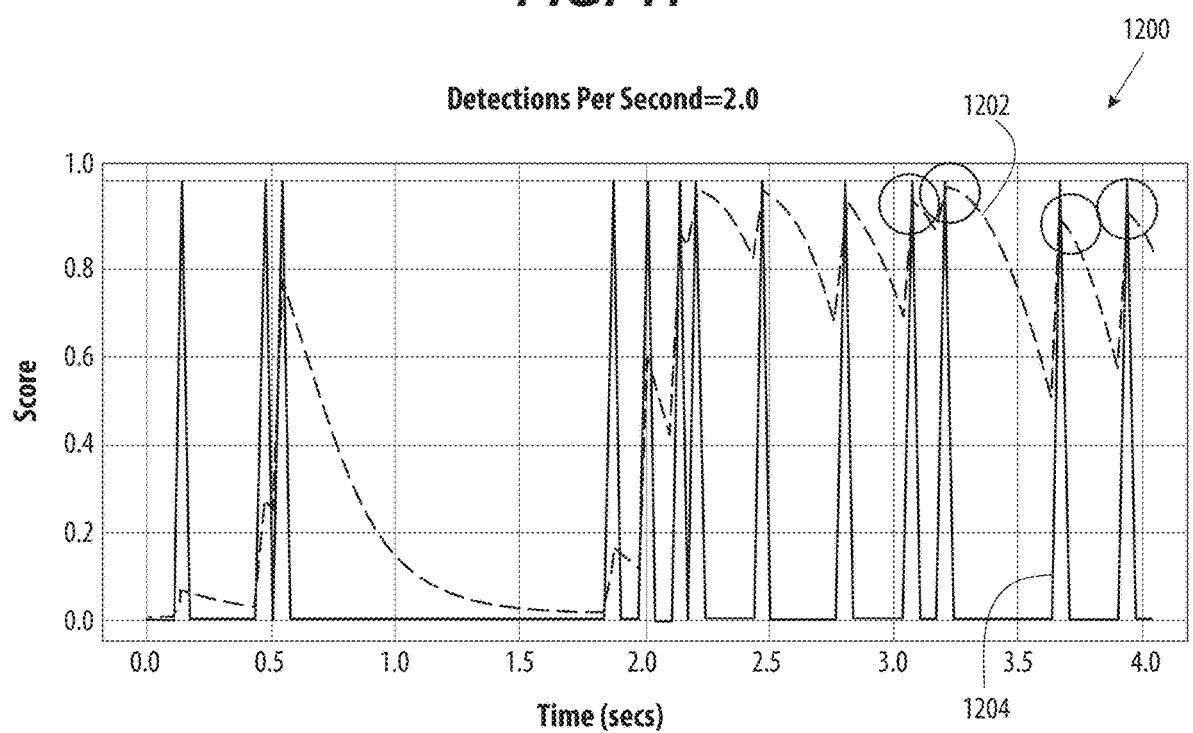
FIG. 12 illustrates a plot scaled temporal processing module output corresponding to a classification module output.

FIG. 12 shows a plot 1200 scaled temporal processing module output 1202 corresponding to a classification module output 1204. Although the scaled temporal processing module output 1202 fluctuates during processing by the classification module 524, temporal processing module 526, and temporal processing module output scaling function 906, it can be seen in FIG. 12 that an arc score 908 may be output at any time during the process in response to certain trigger events. In the embodiment shown, an arc score 908 is output in response to a new positive classification being received by the temporal processing module 526.

Figure 13:
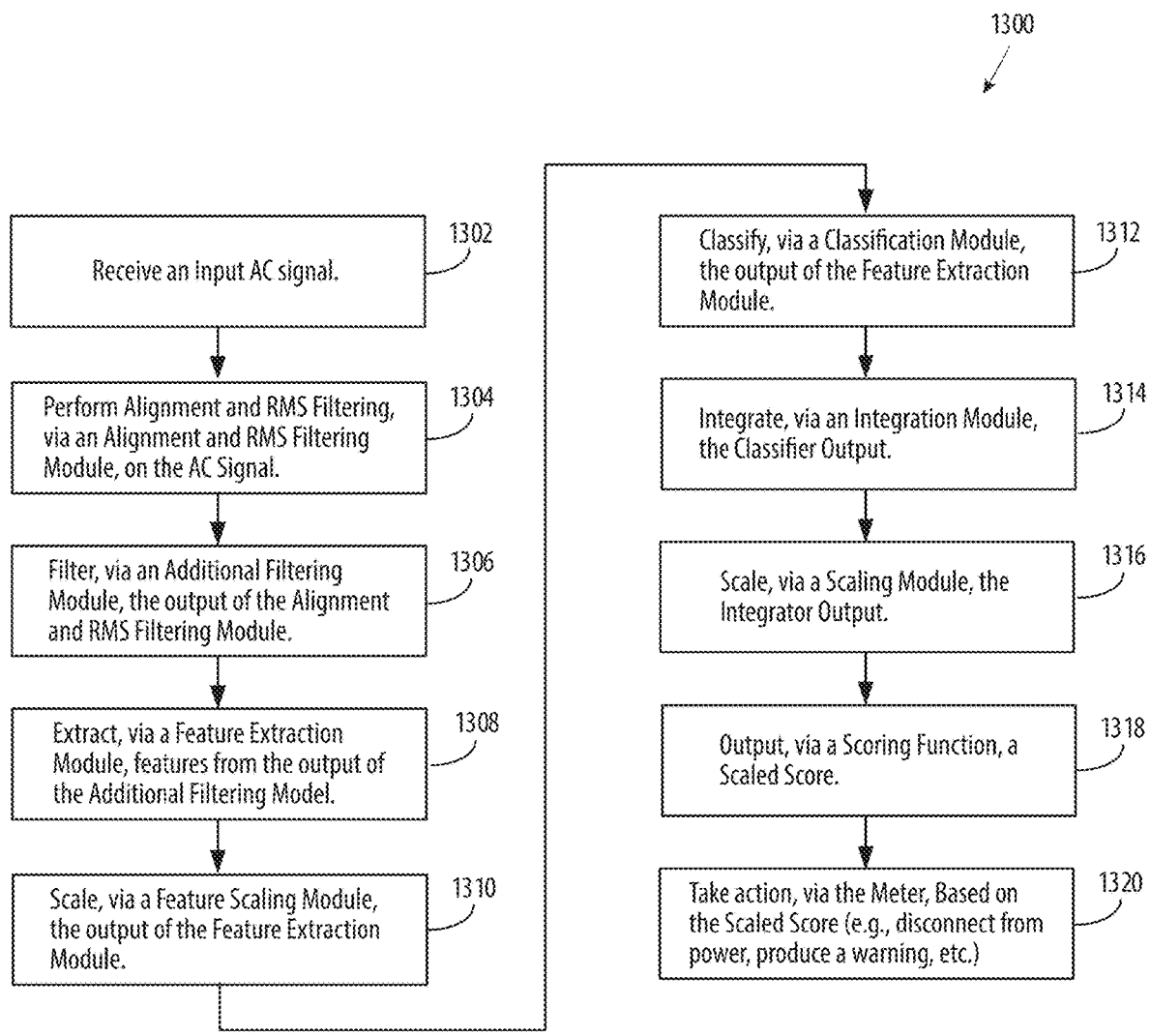
FIG. 13 illustrates a flow chart for processing an input current waveform from a power distribution network via a power monitoring module.

FIG. 13 is a flow chart 1300 for processing an input current waveform 802 from the power distribution network 101 via a power monitoring module 230. The power distribution network 101 may be configured to deliver power 112 to the meter 212 via a transformer 108 in communication with a substation 116. The meter 212 may be configured to analyze the input current waveform 802, via the power monitoring module 230, for evidence of electrical arcing, and to produce a scaled arc score 908 indicative of the likelihood that electrical arcs are occurring on the connection between the meter 212 and the power distribution network 101. Execution of the power monitoring module 230 may include passing the input current waveform 802 through a plurality of processing modules such as the an alignment and RMS Filtering module 504, the additional filtering module 508, the feature extraction module 514, the feature scaling module 522, the classification module 524, and the temporal processing module 526 to produce an arc score at the scoring module 528 described above.

At block 1302, the meter 212 may receive an input current waveform 802 from a power distribution network 101 (e.g., via a transformer 108 or a substation 116) and model, via the power metering circuit 220, the input current waveform 802. The meter 212 may begin analyzing the input current waveform 802 for evidence of electrical arcs by executing a power monitoring module 230, using a processing circuit 222, by first processing the input current waveform 802 using a gating module included in the RMS Filtering module 504.

At block 1304, the processing circuit 222 may perform gating on the input current waveform 802 using an alignment and RMS Filtering module 504. The alignment and RMS Filtering module 504 may be configured to disqualify the input current waveform 802 if an aspect of the input current waveform 802 does not conform to a predefined value range, indicating a high likelihood (e.g., 95%-100% likelihood) that the input current waveform 802 lacks evidence of arc currents. For example, as mentioned above, the alignment and RMS filter 504 may calculate a root-mean-square (RMS) for the input current waveform 302. The alignment and RMS filter 504 may also be configured to flag or disqualify input current waveforms 302 where arcing is not possible (e.g., meter line disconnected or shorted) or in situations where the classification module 524 is likely to misclassify the input current waveform 302 after filtering. After gating and filtering the input current waveform 802, the processing circuit 222 may further filter the input current waveform 802 via an additional filtering module 508.

At block 1306, the processing circuit 222 may use an additional filtering module 508 to apply a filter (e.g., a 60 Hz filter 510, the Gabor filter 512, a HP IIR Filter) to the input current waveform 802 to highlight or isolate portions of the input current waveform 802, and output a unweighted filtered version 606 of the input current waveform 602 so that the highlighted or isolated features may be further analyzed. The additional filtering module 508 may also apply weighting to the unweighted filtered version 606 of the input current waveform 602 to produce a weighted filtered version 608 of the input current waveform 602. After filtering the input current waveform 802, the processing circuit 222 may classify the unweighted filtered version 606 of the input current waveform 602 or weighted filtered version 608 of the input current waveform 602 via a classification module 524.

At block 1308, the processing circuit 222 may perform feature extraction on the input current waveform 602 using the NMSE function 516, the Maximum Contiguous Zeros function 518, or the High Frequency Energy function 520, to identify arc currents in a 2-cycle window of the filtered input current waveform 602. After extracting features from the filtered input current waveform 602, the extracted features may be scaled.

At block 1310, the processing circuit 222 may scale the features extracted by the processor during feature extraction. Then, the extracted features (scaled or unscaled) are classified.

At block 1312, the processing circuit 222 may use a multi-layer perceptron neural network 700 of the classification module 524 to classify one or more 2-cycle windows of data 310 of the features extracted from the input current waveform 602 as containing or not containing features evidencing arc currents in the input current waveform 602. This classification may be performed by the classification module 524 based upon a classification threshold. The classification module 524 may be configured to output a voltage pulse 1006 if the extracted features contain sufficient evidence of an arc current. After classifying the features extracted from, the input current waveform 802, the processing circuit 222 may temporally process the output of the classification module 524 via a temporal processing module 526 by integrating the pulses 1006 received at the temporal processing module over time.

At block 1314, the processing circuit 222 may use a leaky integration method of the temporal processing module 526 to integrate incoming pulses 1006 from the classification module 524 over time. A decay parameter of the leaky integration method may be adjusted, for example, based on user input. The temporal processing module 526 is configured to produce a decay in output when the classification module 524 is not outputting a positive classification pulse 1006. After temporally processing the output of the classification module 524 via the temporal processing module 526, the processing circuit 222 may, in some embodiments, scale the temporal processing module output 1002 via a scaling module 906.

At block 1316, the processing circuit 222 may process the temporal processing module output 1002 using a scaling function of the scaling module 906 to bound the temporal processing module output 1002 for the purpose of assigning an arc score 908 to the input current waveform 802. The scaling function may be a sigmoid function configured to take the temporal processing module output 1002 and output a corresponding value within a predetermine value range (e.g., a value between 01 and 1, a value between 0 and 10, etc.). After (optionally) scaling the temporal processing module output 1002 via the scaling module 906, the processing circuit 222 may produce an arc score for the input current waveform 802 via a scoring module 528. The arc score may be based not only on the temporal processing (e.g., the temporal processing module output 1002) of the filtered input current waveform, but one or more of a sensed temperature of the metering circuit 220, a current time of day, a determined arc gap size, and a determined oxidation level of a connection between the metering circuit 220 and a load.

At block 1318, the processing circuit 222 may output an arc score 908 via the scoring module 528. The scoring module 528 may be configured to output an arc score 908 only when the scaled temporal processing module output meets or surpasses a predetermined value. For example, the scoring module 528 may be configured to only output an arc score 908 of 1 when the scaled temporal processing module output is 0.95 or higher.

At block 1320, the meter 212 may be configured to take action in response to an arc score 908 indicating that evidence of arc currents has been detecting in the input current waveform 802. For example, the meter 212 may disconnect itself from the power distribution network, or to produce a notice and communicate it to a headend via wired or wireless communication in response to an arc score 908 indicating that evidence of arc currents has been detected in the input current waveform 802.

Figure 14:
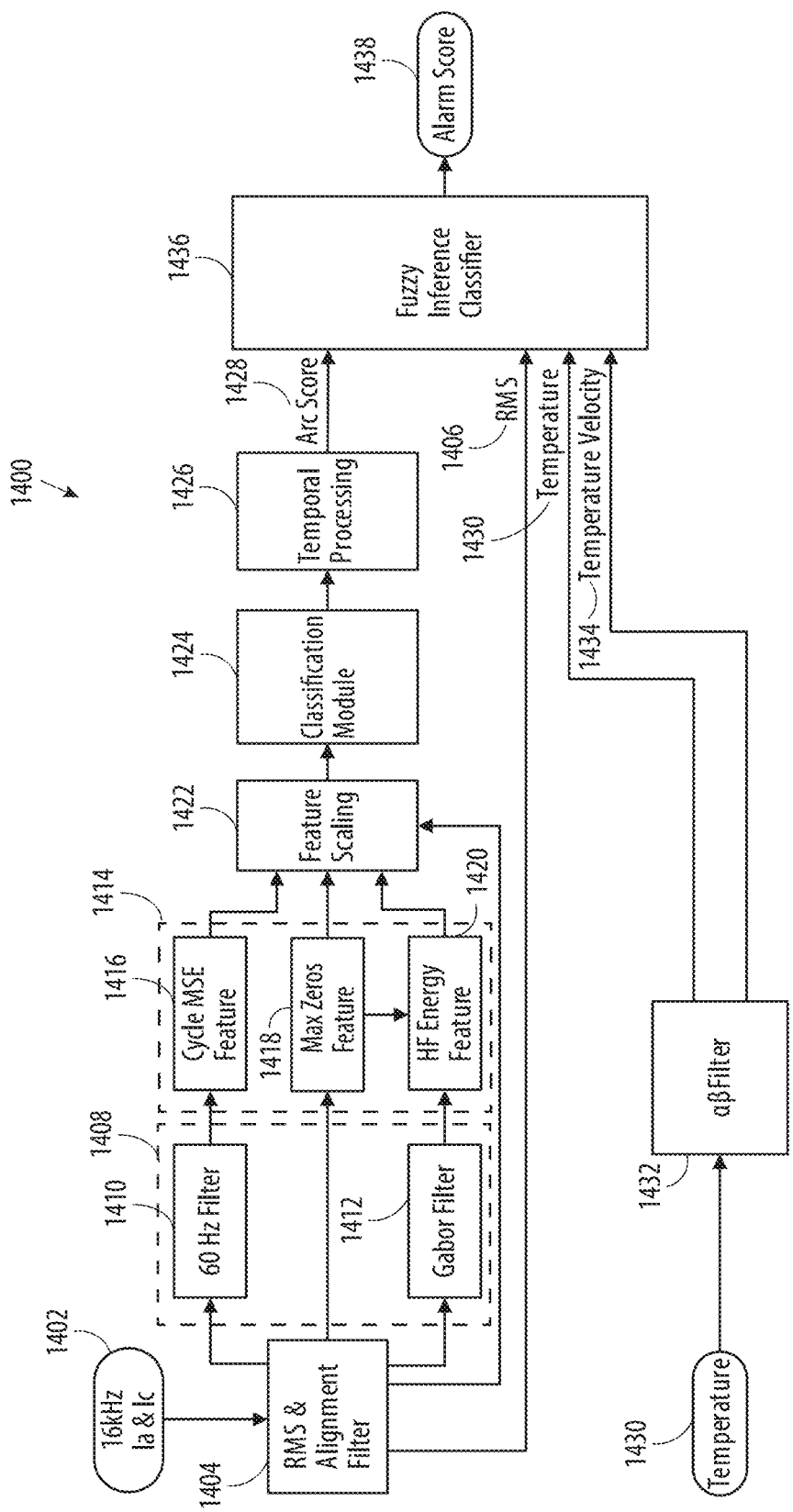
FIG. 14 illustrates a diagram of a system configured to detect series arcing or high temperatures occurring in a meter on a power distribution network.

FIG. 14 shows a diagram 1400 of a system configured to detect that a socket (not shown) of a meter 212 connected to a power distribution network 201 is faulty. In the embodiment shown, an RMS value 1406 and scoring module 1428 are produced according to the method described with respect to FIG. 5, and temperature data is also collected and processed to identify that the socket is faulty. The metering circuit 220 may include a temperature sensor (e.g., an internal contact or ambient temperature sensor, an infrared sensor, a sensor disposed on the processing circuit 222). The metering circuit 220 may produce a temperature value 1430 via such a sensor. The metering circuit 220 may be configured to produce a temperature profile for the meter 212. The temperature profile may be affected by the location of the sensor within the meter (e.g., delay in temperature rise, amplitude and velocity characteristics). The temperature sensor may be configured to sample the temperature value 1430 of the meter 212 at a relatively slow rate. For example, the temperature sensor may be configured to obtain 3 to 10 temperature samples per minute.

In the diagram shown, an alpha-beta filter 1432 processes the temperature value 1430 to produce a temperature velocity 1434. The alpha-beta filter may help smooth noisy measurements by combining a noisy measurement with a predicted output value. The temperature velocity 1434 provides an estimate of how fast the temperature value 1430 is changing. To determine the temperature velocity 1434, the alpha-beta filter combines a temperature prediction term $T_{n+1}=T_n+\Delta t \dot{T}$, where $\dot{T}_{n+1}=\dot{T}_n$ and a temperature measurement term T. The temperature measurement is updated using the following equations:

$$\hat{T}_{n+1} = T_{n+1} + \alpha \, (Z_{n+1} - T_{n+1})$$

$$\hat{\dot{T}}_{n+1} = \dot{T}_{n+1} + \beta \left( \frac{Z_{n+1} - T_{n+1}}{\Delta t} \right)$$

Where $0<\alpha, \beta<1$. In testing, a value of 0.2 was used for $\alpha$ and a value of 0.05 is used for $\beta$.

Figure 16:
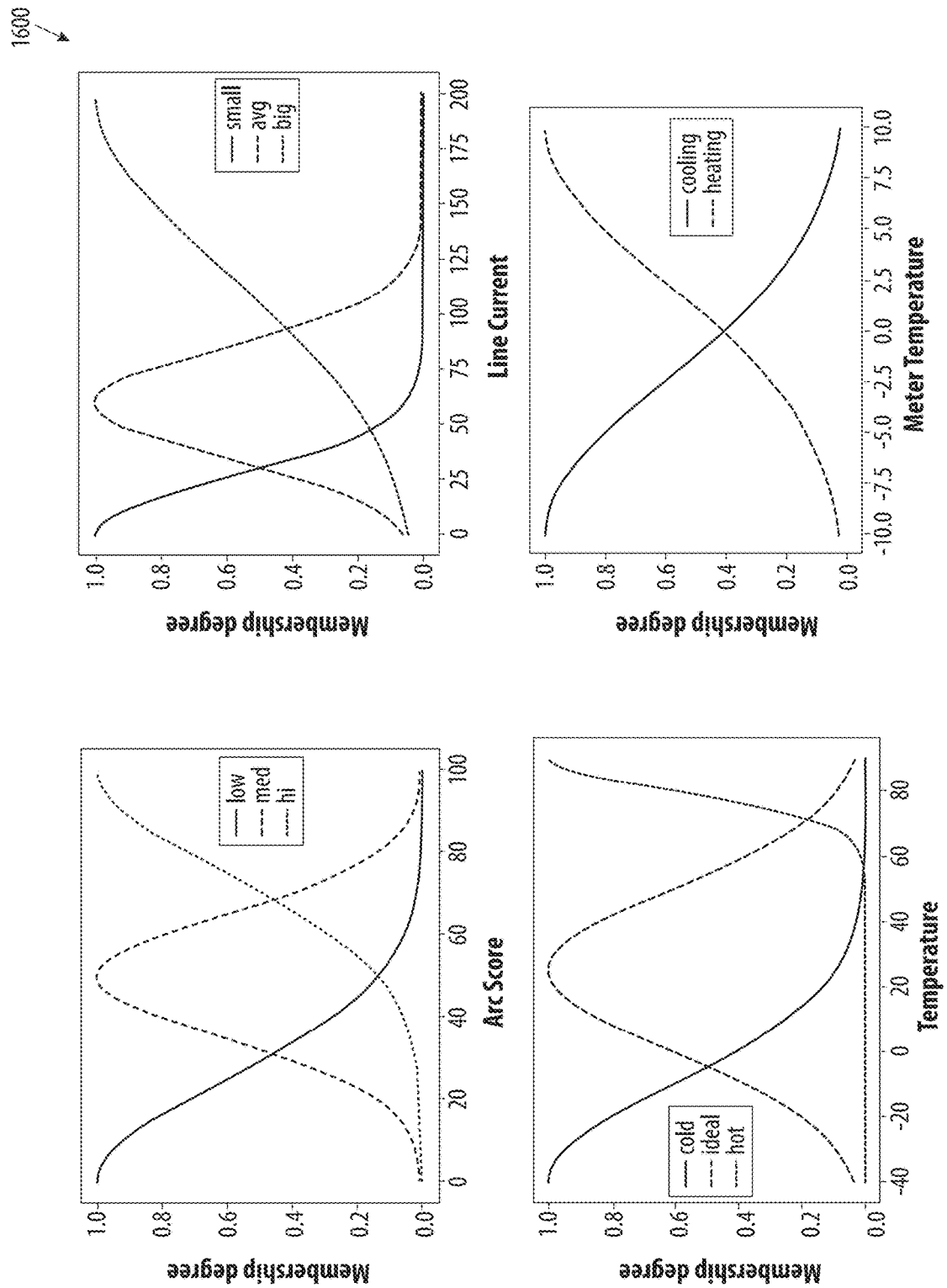
FIG. 16 illustrates a collection of membership functions used by a fuzzy inference classifier to fuzzify a crisp input current waveform.

A fuzzy inference classifier 1436 produces an alarm score 1438 based on the scoring module 1428, the RMS value 1406, the temperature value 1430, and the temperature velocity 1434 as input using fuzzy logic. The scoring module 1428, RMS value 1406, temperature value 1430, and temperature velocity 1434 are input into to the fuzzy inference classifier 1436. The fuzzy inference classifier 1436 uses fuzzy set theory and gaussian membership functions to score the inputs in a non-linear way. Crisp inputs (e.g., numeric value) are identified as having a certain type (e.g., temperature, delta temperature, rms current, arc score) and input to a fuzzifier which associates the crisp input with a loosely defined value (e.g., for temperature input the fuzzifier may associate the input with the value "cold"), based on the input value, to produce a fuzzy input. Membership functions then determine the membership degree of the crisp input to the fuzzified association using gaussian functions. For example, the gaussian functions 1600 shown in FIG. 16 may be used to determine the membership degree of the crips input to the fuzzified association. The inference engine applies rules to the fuzzy input to determine a criticality (e.g., low, medium, high, critical) of the input. Example rules are provided below:

R1="IF (Arcing IS low) AND ((Temp IS ideal) OR (Temp IS cold)) THEN (Score IS low)."

R2="IF (Arcing IS medium) AND (Amps IS big) AND (Delta_Temp IS cooling) AND ((Temp IS ideal) OR (Temp IS cold)) THEN (Score IS low)."

R3="IF (Arcing IS medium) AND (Amps IS big) AND (Delta_Temp IS heating) AND ((Temp IS ideal) OR (Temp IS cold)) THEN (Score IS medium)."

R4="IF (Arcing IS medium) AND (Amps IS average) AND (Delta_Temp IS cooling) AND ((Temp IS ideal) OR (Temp IS cold)) THEN (Score IS low)."

R5="IF (Arcing IS medium) AND (Amps IS avg) AND (Delta_Temp IS heating) AND (Temp IS ideal) THEN (Score IS high)."

R6="IF (Arcing IS medium) AND (Amps IS average) AND (Delta_Temp IS heating) AND (Temp IS cold) THEN (Score IS medium)."

R7="IF (Arcing IS medium) AND (Amps IS small) AND (Delta_Temp IS cooling) AND ((Temp IS ideal) OR (Temp IS cold)) THEN (Score IS low)."

R8="IF (Arcing IS medium) AND (Amps IS small) AND (Delta_Temp IS heating) AND ((Temp IS ideal) OR (Temp IS cold)) THEN (Score IS high)."

R9="IF (Arcing IS high) AND (Amps IS big) AND (Delta_Temp IS cooling) THEN (Score IS high)."

R10='IF (Arcing IS high) AND (Amps IS big) AND (Delta_Temp IS heating) THEN (Score IS critical)."

R11="IF (Arcing IS high) AND (Amps IS average) AND (Delta_Temp IS cooling) THEN (Score IS critical)."

R12="IF (Arcing IS high) AND (Amps IS average) AND (Delta_Temp IS heating) THEN (Score IS critical)."

R13="IF (Arcing IS high) AND (Amps IS small) AND (Delta_Temp IS cooling) THEN (Score IS critical)."

R14="IF (Arcing IS high) AND (Amps IS small) AND (Delta_Temp IS heating) THEN (Score IS critical)."

R15="IF (Temp IS hot) THEN (Score IS critical)."

Based on the determined criticality of the input, the output of the gaussian membership functions is weighted according to a weighting function:

$$\text{Output} = \frac{W_{low} * 0 + W_{med} * 40 + W_{high} * 75 + W_{critical} * 100}{W_{low} + W_{med} + W_{high} + W_{critical}}$$

The output of the fuzzy inference classifier 1436 may be used as the alarm score 1438.

Figure 15:
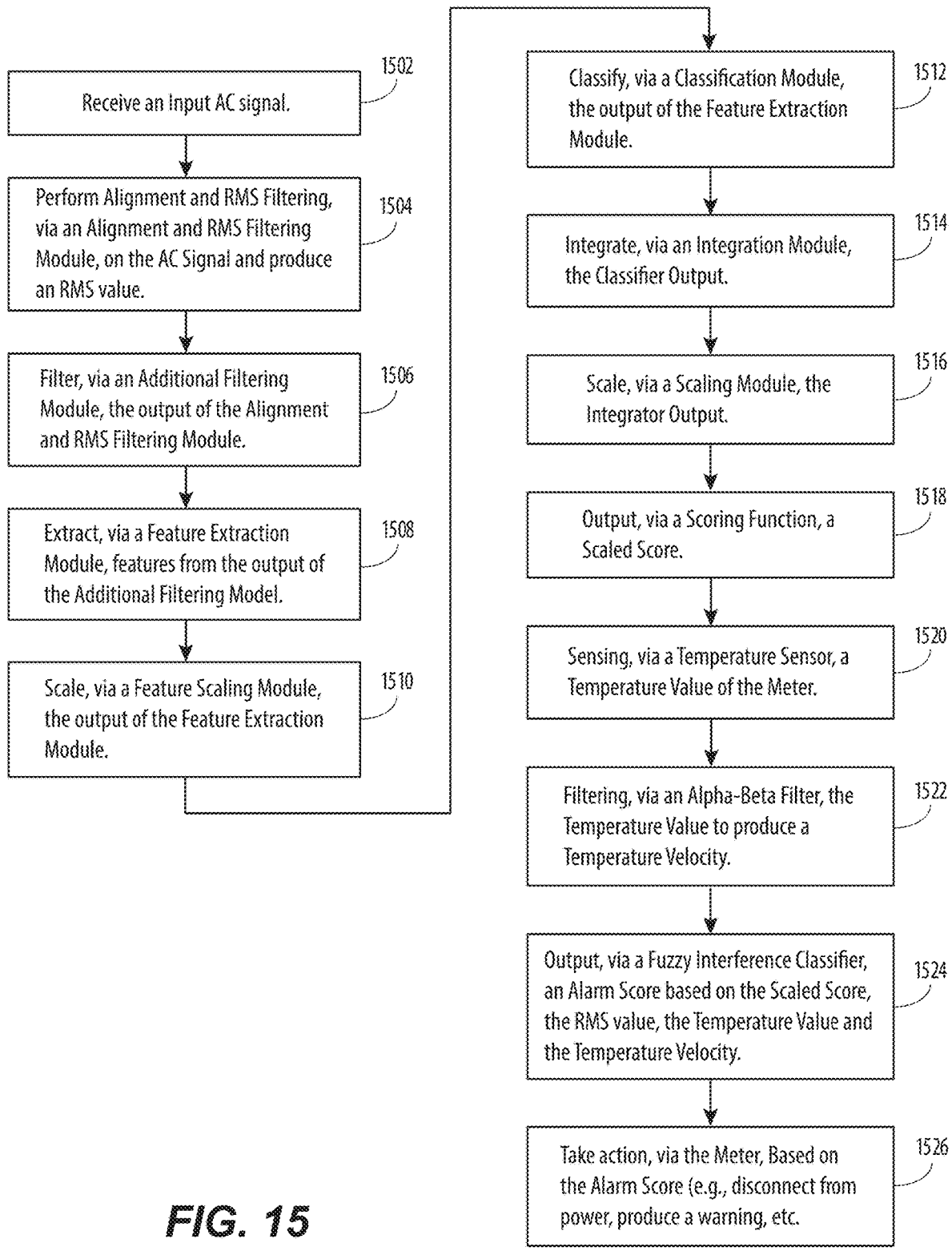
FIG. 15 illustrates a flow chart for processing an input current waveform from a power distribution network via a power monitoring module.

FIG. 15 is a flow chart 1500 for processing an input current waveform 802 from the power distribution network 101 via a power monitoring module 230. The power distribution network 101 may be configured to deliver power 112 to the meter 212 via a transformer 108 in communication with a substation 116. The meter 212 may be configured to analyze the input current waveform 802, via the power monitoring module 230, for evidence of electrical arcing, and to produce a scaled arc score 908 indicative of the likelihood that electrical arcs are occurring on the connection between the meter 212 and the power distribution network 101. Execution of the power monitoring module 230 may include passing the input current waveform 302 through a plurality of processing modules such as the alignment and RMS filtering module 1402, the additional filtering module 1408, the feature extraction module 1414, the feature scaling module 1422, the classification module 1424, and the temporal processing module 1426 to produce and scoring module 1428 described above.

At block 1502, the meter 212 may receive an input current waveform from a power distribution network 101 (e.g., via a transformer 108 or a substation 116) and model, via the power metering circuit, the input current waveform 302. The meter 212 may begin analyzing the input current waveform 302 for evidence of electrical arcs by executing a power monitoring module 230, using a processing circuit 222, by first processing the input current waveform 802 using a gating module included in the RMS Filtering module 1404.

At block 1504, the processing circuit 222 may perform gating on the input current waveform 802 using an alignment and RMS filtering module 1402. The alignment and RMS filtering module 1402 may be configured to disqualify the input current waveform 802 if an aspect of the input current waveform 802 does not conform to a predefined value range, indicating a high likelihood (e.g., 95%-100% likelihood) that the input current waveform 802 lacks evidence of arc currents. For example, as mentioned above, the alignment and RMS filter 1404 may calculate a root-mean-square (RMS) for the input current waveform 302. The alignment and RMS filter 1404 may also be configured to flag or disqualify input current waveforms 302 where arcing is not possible (e.g., meter line disconnected or shorted) or in situations where the classification module 1424 is likely to misclassify the input current waveform 302 after filtering. After gating and filtering the input current waveform 802, the processing circuit 222 may further filter the input current waveform 802 via an additional filtering module 1408.

At block 1506, the processing circuit 222 may use an additional filtering module 1408 to apply a filter (e.g., a 60 Hz filter 1410, the Gabor filter 1412, a HP IIR Filter) to the input current waveform 802 to highlight or isolate portions of the input current waveform 802, and output a unweighted filtered version 606 of the input current waveform 602 so that the highlighted or isolated features may be further analyzed. The additional filtering module 1408 may also apply weighting to the unweighted filtered version 606 of the input current waveform 602 to produce a weighted filtered version 608 of the input current waveform 602. After filtering the input current waveform 802, the processing circuit 222 may classify the unweighted filtered version 606 of the input current waveform 602 or weighted filtered version 608 of the input current waveform 602 via a classification module 1424.

At block 1508, the processing circuit 222 may perform feature extraction on the input current waveform 602 using the NMSE function 1416, the Maximum Contiguous Zeros function 1418, or the High Frequency Energy function 1420, to identify arc currents in a 2-cycle window of the filtered input current waveform 602. After extracting features from the filtered input current waveform 602, the extracted features may be scaled.

At block 1510, the processing circuit 222 may scale the features extracted by the processor during feature extraction. Then, the extracted features (scaled or unscaled) are classified.

At block 1512, the processing circuit 222 may use a multi-layer perceptron neural network 700 of the classification module 1424 to classify one or more 2-cycle windows of data 310 of the features extracted from the input current waveform 602 as containing or not containing features evidencing arc currents in the input current waveform 602. This classification may be performed by the classification module 1424 based upon a classification threshold. The classification module 1424 may be configured to output a voltage pulse 1006 if the extracted features contain sufficient evidence of an arc current. After classifying the features extracted from, the input current waveform 802, the processing circuit 222 may temporally process the output of the classification module 1424 via a temporal processing module 1426 by integrating the pulses 1006 received at the temporal processing module over time.

At block 1514, the processing circuit 222 may use a leaky integration method of the temporal processing module 1426 to integrate incoming pulses 1006 from the classification module 1424 over time. A decay parameter of the leaky integration method may be adjusted, for example, based on user input. The temporal processing module 1426 is configured to produce a decay in output when the classification module 1424 is not outputting a positive classification pulse 1006. After temporally processing the output of the classification module 1424 via the temporal processing module 1426, the processing circuit 222 may, in some embodiments, scale the temporal processing module output 1002 via a scaling module 906.

At block 1516, the processing circuit 222 may process the temporal processing module output 1002 using a scaling function of the scaling module 906 to bound the temporal processing module output 1002 for the purpose of assigning an arc score 908 to the input current waveform 802. The scaling function may be a sigmoid function configured to take the temporal processing module output 1002 and output a corresponding value within a predetermine value range (e.g., a value between 01 and 1, a value between 0 and 10, etc.). After (optionally) scaling the temporal processing module output 1002 via the scaling module 906, the processing circuit 222 may produce an arc score 908 for the input current waveform 802 via a scoring module 1428. The arc score 908 may be based not only on the temporal processing (e.g., the temporal processing module output 1002) of the filtered input current waveform, but one or more of a sensed temperature of the metering circuit 220, a current time of day, a determined arc gap size, and a determined oxidation level of a connection between the metering circuit 220 and a load.

At block 1518, the processing circuit 222 may output an arc score 908 via the scoring module 1428. The scoring module 1428 may be configured to output an arc score 908 only when the scaled temporal processing module output meets or surpasses a predetermined value. For example, the scoring module 1428 may be configured to only output an arc score 908 of 1 when the scaled temporal processing module output is 0.95 or higher.

At block 1520, a temperature sensor connected to the processing circuit 222 produces a temperature value 1430 by measuring a temperature of the meter 112.

At block 1522, the processing circuit 222 applies an alpha-beta filter 1432 to the temperature value 1430 to produce a temperature velocity 1434, indicating the rate at which the temperature value 1430 is changing.

At block 1524, the processing circuit 222 inputs the scoring module 1428, the RMS value 1406, the temperature 1430, and the temperature velocity 1434 to a fuzzy inference classifier 1436 to produce an alarm score 1438.

At block 1526, the meter 212 may be configured to take action in response to an arc score 908 indicating that evidence of arc currents has been detecting in the input current waveform 802. For example, the meter 212 may disconnect itself from the power distribution network, or to produce a notice and communicate it to a headend via wired or wireless communication in response to an arc score 908 indicating that evidence of arc currents has been detected in the input current waveform 802.

Other methods of determining socket integrity (e.g., detecting series arcs) are contemplated. These other methods are discussed below.

In some embodiments, evidence of arc currents may be detected in the input current waveform 802 using a pulse train detection algorithm. Specifically, electrical arcs can be determined to be part of a series of electrical arcs by using a pulse train detection algorithm on the output of the filtering module 504. Often, energy spikes can be identified in the unweighted filtered version 606 of the input current waveform 602 and the weighted filtered version 608 of the input current waveform 608 near the half cycle point (i.e., at the zero-crossings 605). Electrical arcs often generate high frequency pulse data at zero-crossings 605, but the exact location, magnitude and time length of each pulse may vary. A pulse train detection algorithm may be used to detect evidence of series arcs in the weighted filtered input current waveform 602 over time to determine if a series is present. A Fast Folding Algorithm (FFA) may be used as such a pulse detection algorithm. The FFA may take a section of noisy frequency data obtained from the input current waveform 802 and perform a series of additions and shifts to extract periodic signals. If a pulse train of period P is embedded in an unweighted filtered version 606 of the input current waveform 602 or weighted filtered version 608 of the input current waveform 608 of length N, then it may be detected by additively folding the data on itself with period P. The result would consist of P elements $s_j$ where, $$s_j = \sum_{k=0}^{(N/P)-1} d_{j+kP}$$

The folding operation may form a matrix of size (N/P, P) and perform a summation on each column. If several P values are used, then many of the additions may be redundant, and the algorithm helps to remove the redundancy. In addition to providing computational savings, the FFA may also provide sub-sample accuracy on the period calculation, P, according to:

$$P = P_0 + \left(\frac{P_0 + 1}{N}\right)(n-1)$$

where N is the length of the data segment and $P_0$ is the base period in number of samples. The FFA algorithm may be used to compute output matrices for periods a variety of periods (e.g., P=3, 3.25, 3.5, 3.75 and 4.0). In many embodiments, the output matrices are the same size as the input matrix (N/P, P). The rows of the output are the data sums for each period P. The maximum value in each of the output matrices (rows) may then be taken as a single point in the final output at that period P. For a rounded analysis of a waveform, several values of $P_0$ may be run over the designed range. For example, if the sample rate is 16.080 kHz, a probable period $P_0$ is 134 samples, but it may be useful to use several values of $P_0$. The FFA may be used to compute partial sample periods with a reduced number of additions. Additionally, computing the fractional periods may involve shifting the individual rows and then doing the additions, where the shift does involve wrap around so that all of the data is used in every calculation. Overall, the FFA algorithm may involve mostly additions and possibly a single division for normalization and is therefore very efficient. Further computational savings may be gained by limiting the number of folding periods that are computed.

Figure 17:
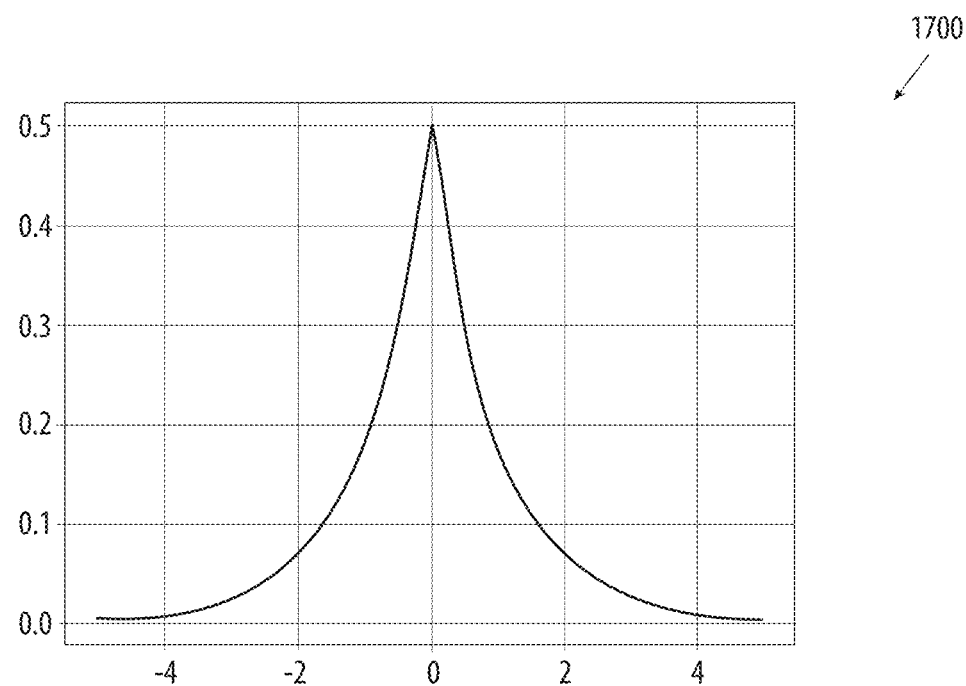
FIG. 17 illustrates a parametric model of an electrical arc.
Figure 18:
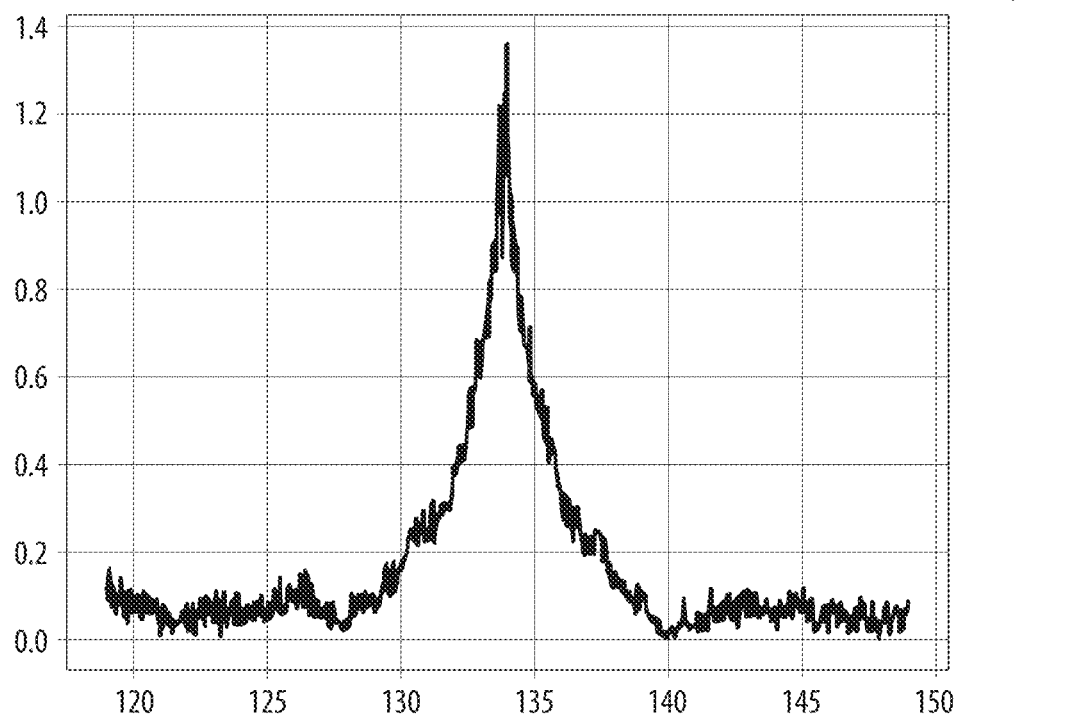
FIG. 18 illustrates a current over time plot of an electrical arc.
Figure 19:
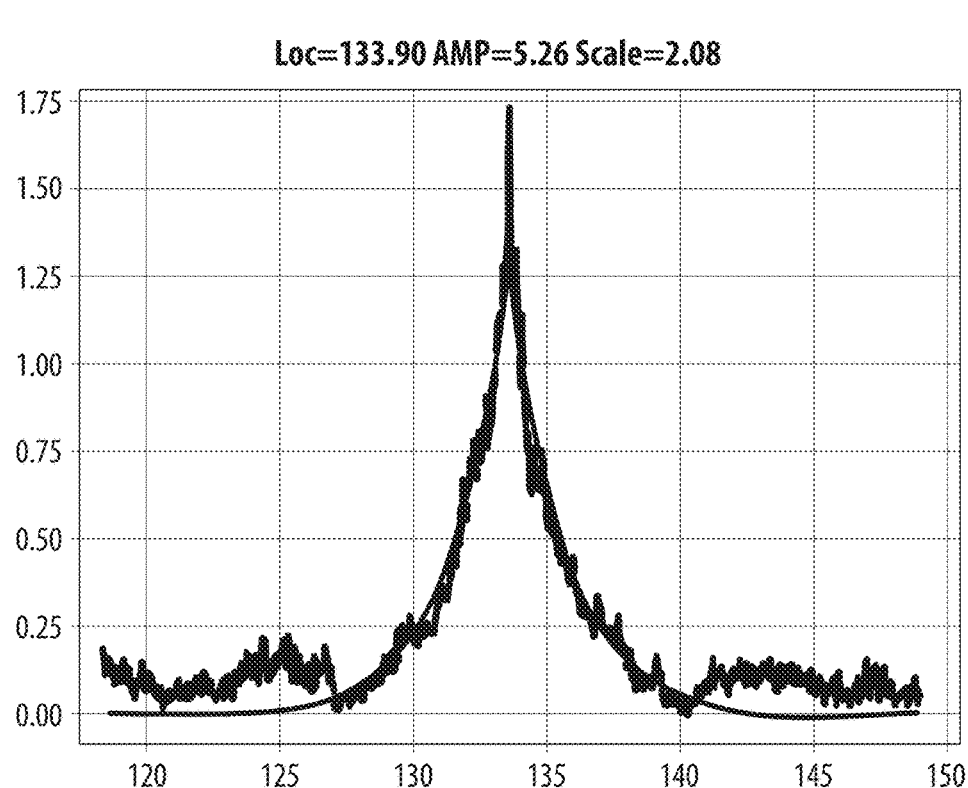
FIG. 19 illustrates a parametric model of an electrical arc fit to a plot of an electrical arc.
Figure 20:
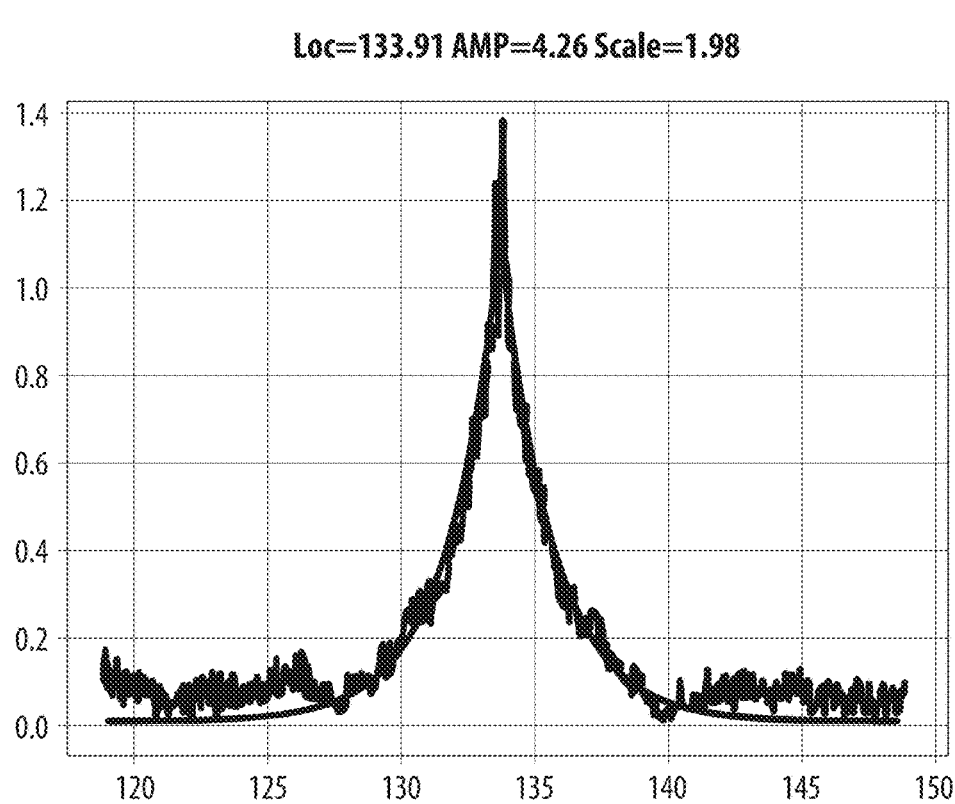
FIG. 20 illustrates a parametric model of an electrical arc fit to plot of an electrical arc.
Figure 21:
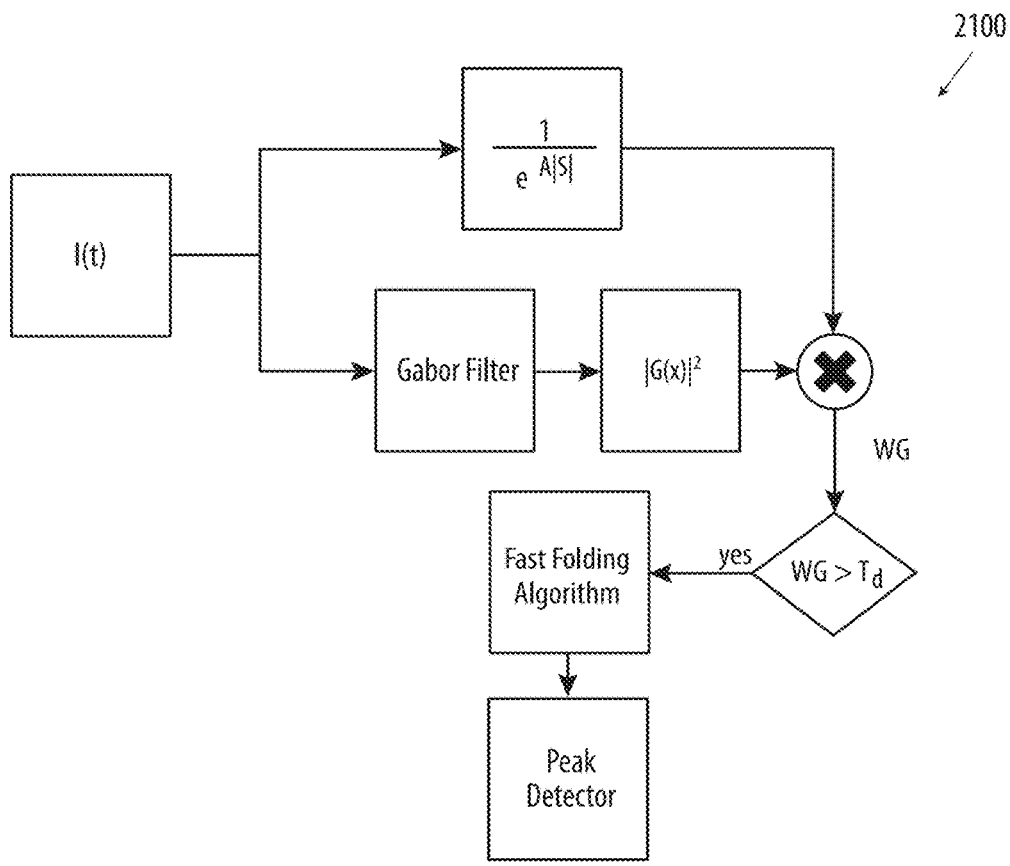
FIG. 21 illustrates a block diagram illustrating the pulse train detection algorithm method of series electrical arc detection using a folding algorithm.

The output of the Fast Folding Algorithm may be further processed to extract features that may be used to determine if a series arc fault is present. Certain features may be targeted in the extraction process so that, once extracted the extracted features provide a good basis for differentiation between fault data and non-fault data. One feature extraction approach may be to define a parametric model 1700 (shown in FIG. 17) of an example electrical arc 1800 (shown in FIG. 18) as it may appear in the unweighted filtered version 606 of the input current waveform 602, and weighted filtered version 608 of the input current waveform 608. The parametric model 1700 may be defined by:

$$f(x) = \alpha \frac{e^{-\left|\frac{x-\mu}{\beta}\right|}}{2\beta}$$

where $\alpha$ is the amplitude parameter, $\mu$ is the location parameter and $\beta$ is the scale parameter. Fitting the parametric model 1700 to the example electrical arc 1800 may comprise by using a curve fitting function on the plot of the example electrical arc 1500 by adjusting the amplitude parameter $\mu$, the location parameter, and the scale parameter $\beta$ of the parametric model 1500. The curve fitting function may be configured to choose the parameters with a goal of minimizing the sum of the squared residuals. Some example curve fittings are shown in FIGS. 19 and 20. A processing block diagram 2100 illustrating the Fast Folding Algorithm method of socket integrity detection is shown in FIG. 21.

Further computational savings may be gained by limiting the number of folding periods that are computed. The output of the Fast Folding Algorithm may be further processed to extract features that may be used to determine if a series arc fault is present.

In testing, a Kellems example arc_5a_arc2 was divided into 12 10 cycle sections for analysis and testing of the pulse train detection algorithm. The first four sections contain data without series arc events and the last seven contain series arc events and the fifth sections is a combination of the two types of events. The parameter data is listed below in Table 1.

TABLE 1

| Class | Location | Amplitude | Scale | DC Offset |
| --- | --- | --- | --- | --- |
| No Arc | 133.55 | 0.60 | 24.86 | 0.05 |
| No Arc | 133.64 | 0.46 | 21.97 | 0.05 |
| No Arc | 132.37 | 0.58 | 23.54 | 0.05 |
| No Arc | 133.49 | 0.45 | 18.47 | 0.05 |
| Partial Arc | 133.94 | 4.13 | 3.97 | 0.21 |
| Arc | 134.0 | 4.85 | 1.84 | 0.35 |
| Arc | 133.90 | 5.26 | 2.08 | 0.35 |
| Arc | 133.99 | 3.95 | 1.97 | 0.32 |
| Arc | 133.91 | 4.26 | 1.98 | 0.34 |
| Arc | 134.05 | 4.55 | 2.05 | 0.34 |
| Arc | 133.90 | 4.67 | 2.09 | 0.34 |
| Arc | 133.94 | 4.32 | 2.02 | 0.34 |

Figure 22:
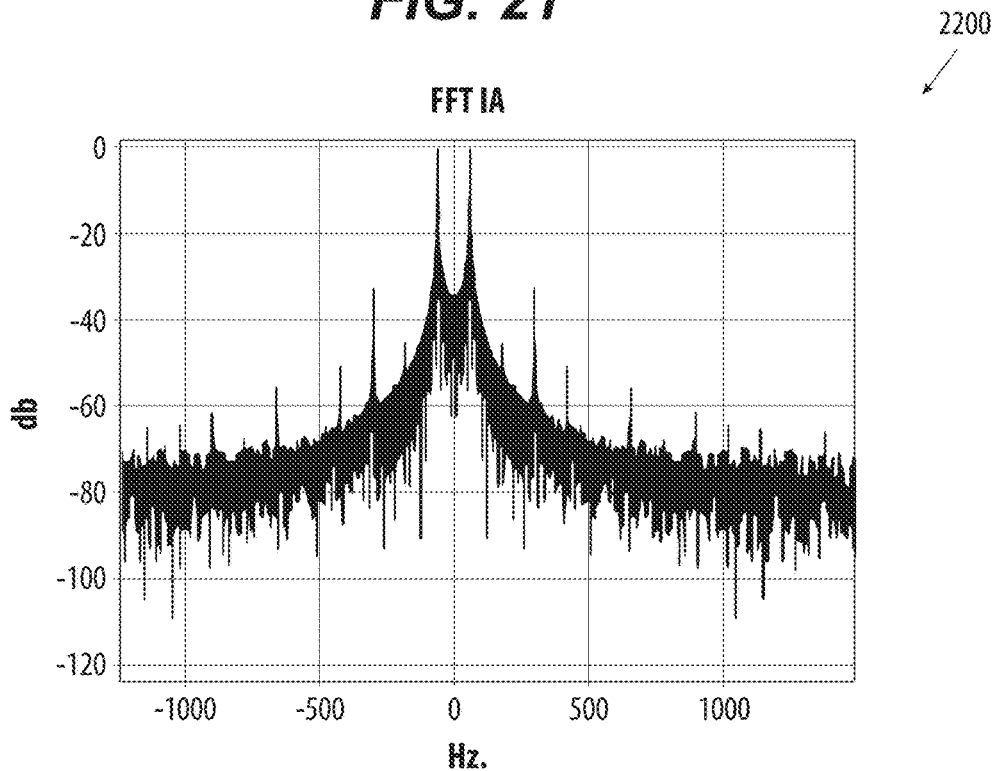
FIG. 22 illustrates a decibels over hertz plot of an electrical arc.
Figure 23:
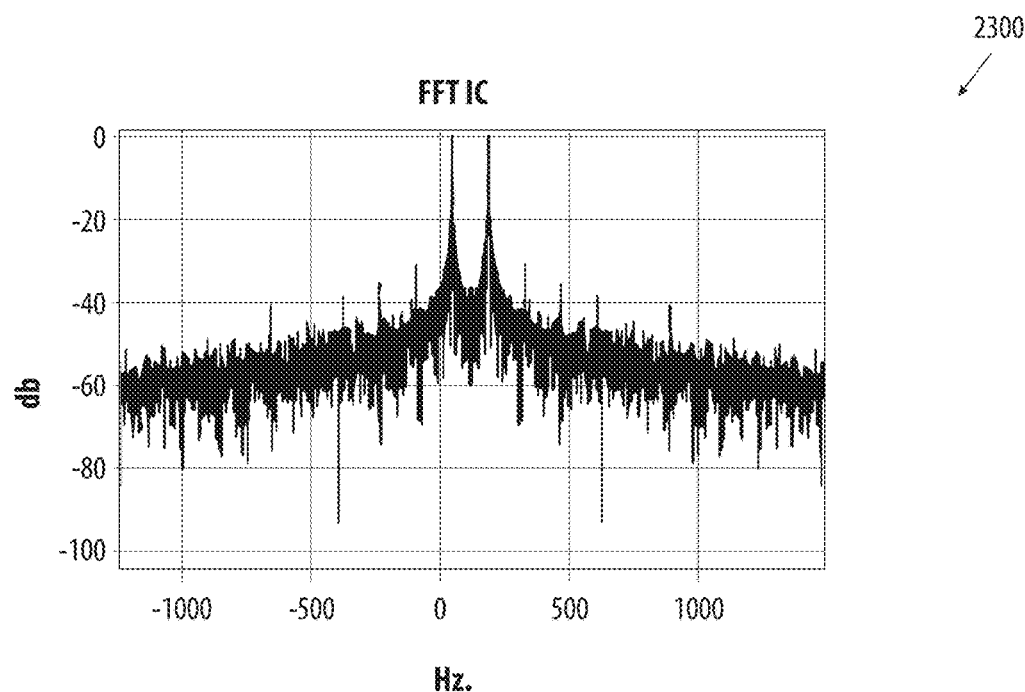
FIG. 23 illustrates a decibels over hertz plot of an electrical arc.
Figure 24:
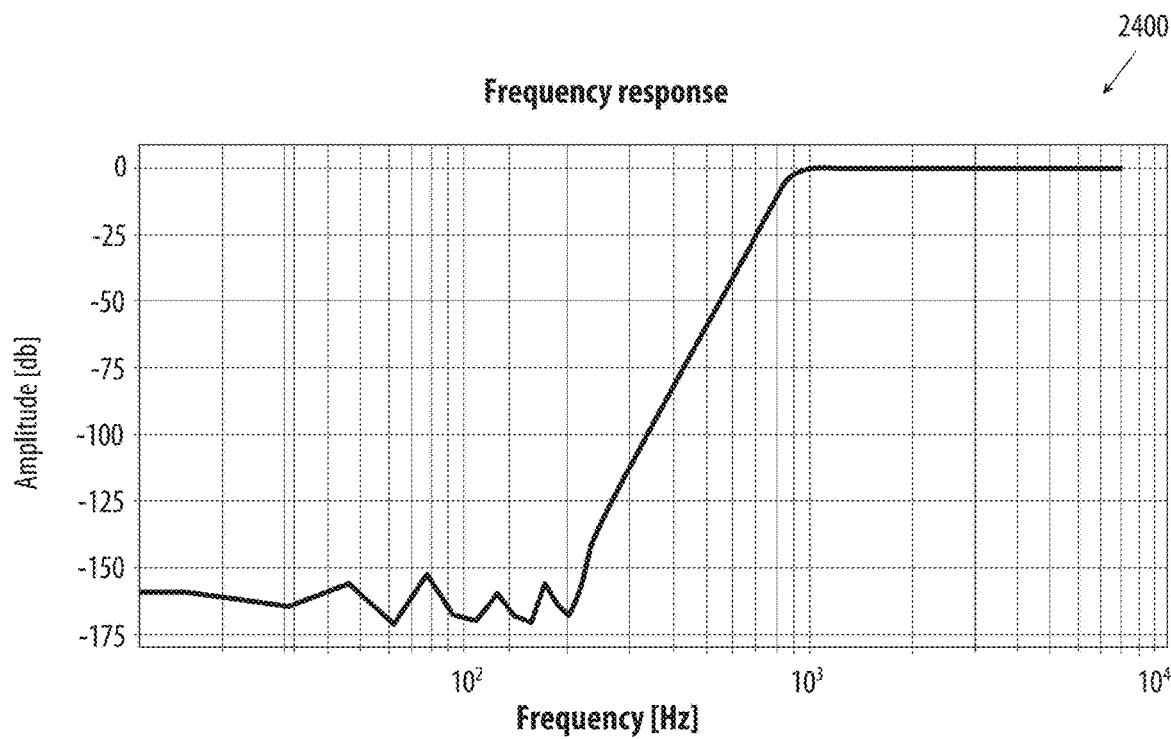
FIG. 24 illustrates a frequency response of a cutoff frequency of a Butterworth high pass filter.
Figure 25:
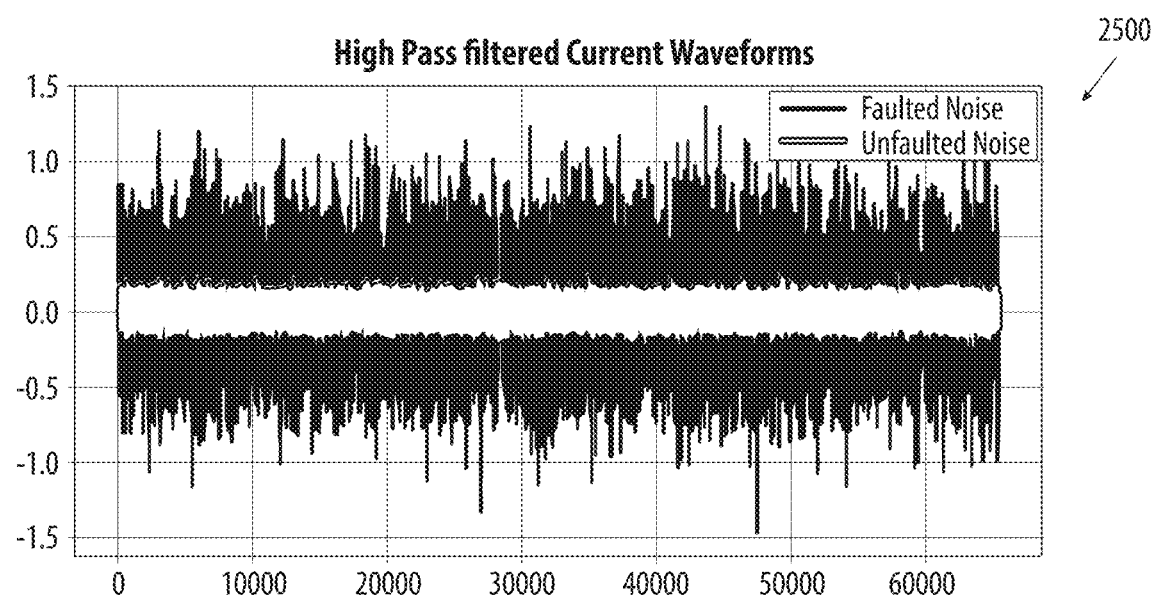
FIG. 25 illustrates a signal filtered by a Butterworth high pass filter.
Figure 26:
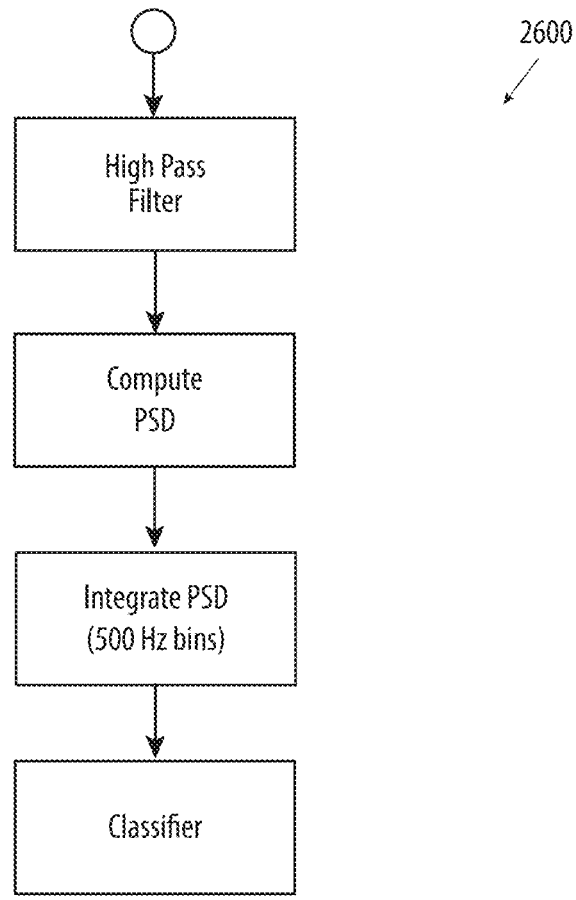
FIG. 26 illustrates a flow chart of an approach to a power spectral density method of electrical arc detection.

In some embodiments, differences in the high frequency spectral content of the waveforms containing evidence of electrical arcs and waveforms not containing evidence of electrical arcs may be used to distinguish waveforms according to a power spectral density analysis method. Evidence of electrical arcs may come in the form of a more "peaked" spectrum than the relatively flat spectrum of a non-arcing waveform. Harmonics generated by the load can be seen in a zoomed in view of the spectrum. For example, in FIG. 22, the $15^{th}$ harmonics (900 Hz.) is 60 dB below the fundamental peak of the signal 2200 and in FIG. 23, the $15^{th}$ harmonic is buried in noise contained in the signal 2300. It may be possible characteristics to use the high frequency noise components of signals to differentiate between a signal containing evidence of arc currents from not signals containing evidence of arc currents. A $12^{th}$ order Butterworth high pass filter may be used to extract the high frequency "noise" components from an input current waveform 802 for analysis. In testing, a cutoff frequency of the Butterworth high pass filter was designed to be 889 Hz. The filter frequency response 2400 is shown in FIG. 24. The signals filtered by the aforementioned Butterworth high pass filter 2500 (shown in FIG. 25) look like random noise, therefore, the Power Spectral Density (PSD), which estimates the power of a random signal across the frequency spectrum, is an appropriate analysis tool. The PSD may be integrated over wider bands (~500 Hz) and analyze to determine the total energy of the frequency band extracted by the Butterworth high pass filter as a feature factored into the classification performed by the classification module 506. For instance, several such band power values could be calculated and used to train the multilayer perceptron neural network 700. A flow chart 2600 of an approach to the Power Spectral Density method of socket integrity detection is shown in FIG. 26.

In some embodiments, higher order statistics may be used in many diverse applications from EEG signal analysis to vibrating machinery diagnostics. In some embodiments, these techniques may be applied to series arc fault detection. The bispectrum is the first in a series of higher order statistics. It has similarities to the Power Spectral density in that it is a Fourier transform of the $3^{rd}$ Cumulant and generally defines the skewness, or asymmetry, of the distribution.

$$B_x(w_1,w_2)=\Sigma\Sigma c_3(\lambda_1,\lambda_2)e^{-j(w_1\lambda_1+w_2\lambda_2)}$$

Where $C_3$ is defined as:

$$c_3(\lambda_1,\lambda_2)=E(x(k),x(k+\lambda_1),x(k+\lambda_2))$$

A more intuitive way to express the bispectrum is using the FFT of the target signal, $X(w_t)$:

$$B_x(w_1,w_2)=x(w_1)x(w_2)X^*(w_1+w_2)$$

Figure 27:
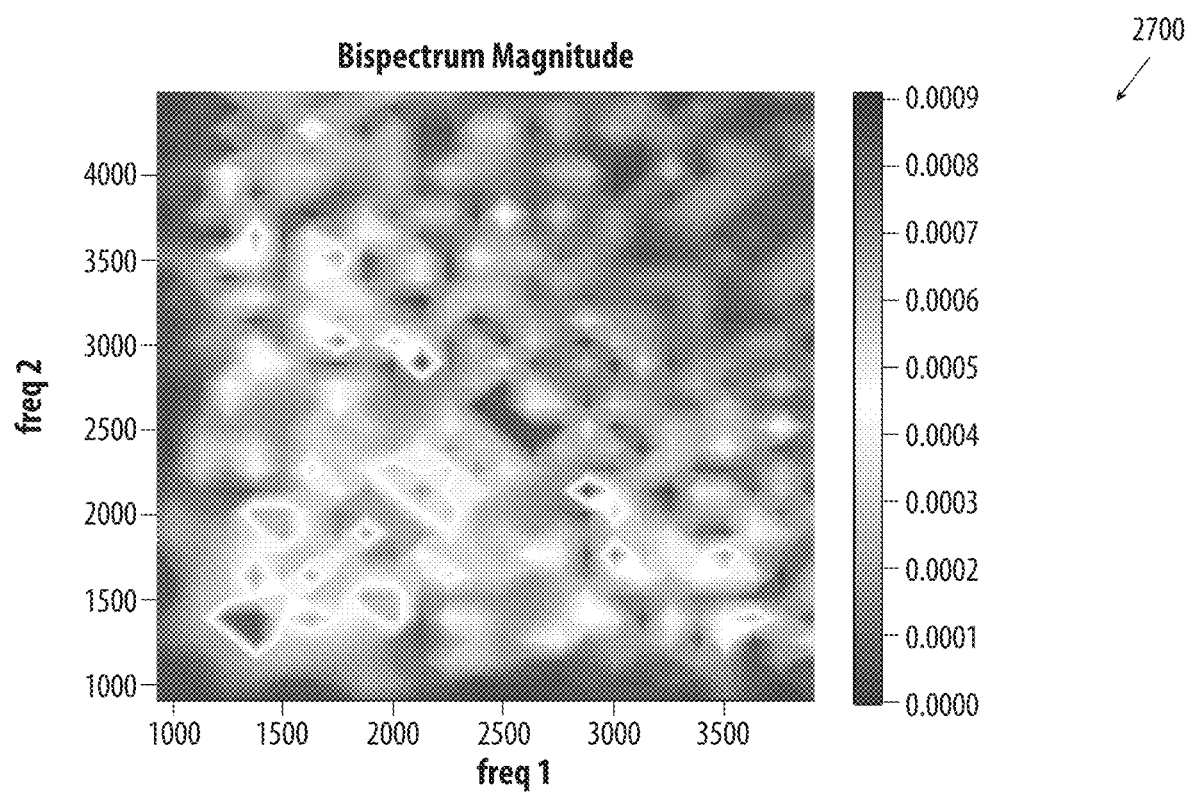
FIG. 27 illustrates a plot of a bispectrum for an input current waveform not including arc currents.
Figure 28:
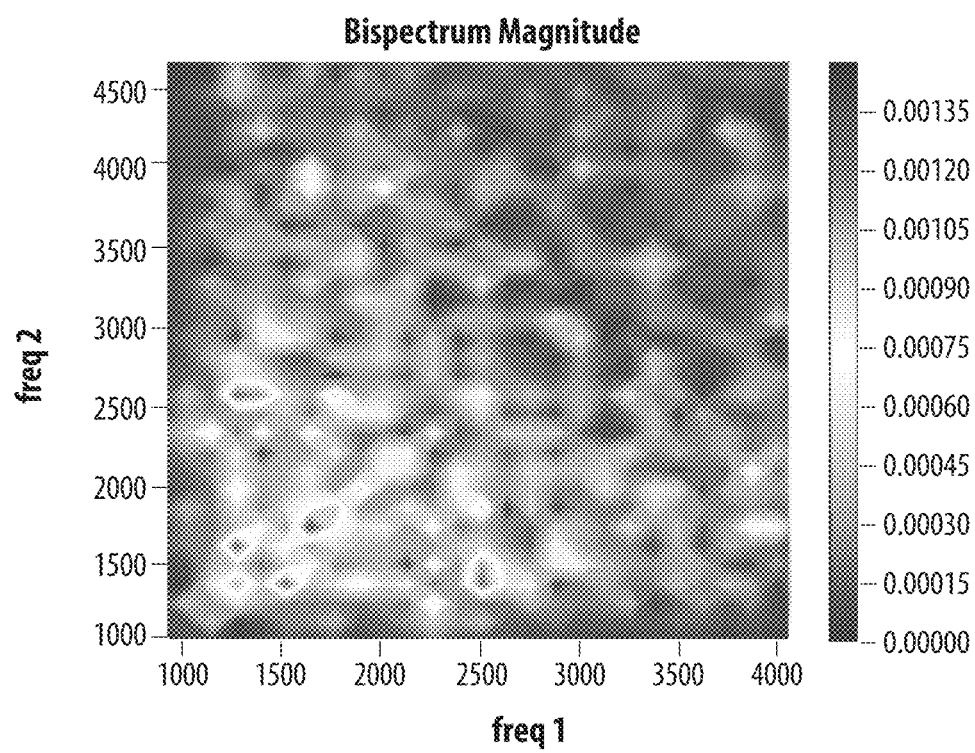
FIG. 28 illustrates a plot of a bispectrum for an input current waveform including arc currents.

Example plots 2700, 2800 of a bispectrum for an input current waveform not including arc currents and an input current waveform including arc currents are shown in FIGS. 27 and 28.

In some embodiments, a Cepstrum 2900 is used to detect series arcs in an input current wave 802. The Cepstrum 2900 (shown in FIG. 29) is a signal processing tool originally created for analyzing seismic echoes from earthquakes and bomb explosions. The Cepstrum is defined as the Fourier transform of the natural log of the power spectral density 3000 (shown FIG. 30). In some embodiments, the Cepstrum 2900 can be used to look for periodic components of the power spectral density. The Cepstrum 2900 can be defined as $$C_p=|F[\log(|F[f(t)]|^2)]$$

Where F is the Fourier transform operation. The natural log function acts to compress the elements of the PSD so that the Cepstrum 2900 captures a large dynamic range and enables low amplitude components to become visible. The natural log function also converts multiplication in the frequency domain (convolution in the time domain) to addition in the Cepstrum domain. Therefore:

$$(y)(t)=h(t)*x(t), Y(f)=H(f)X(f), y_c(\lambda)=h_c(\lambda)+x_c(\lambda)$$

Figure 29:
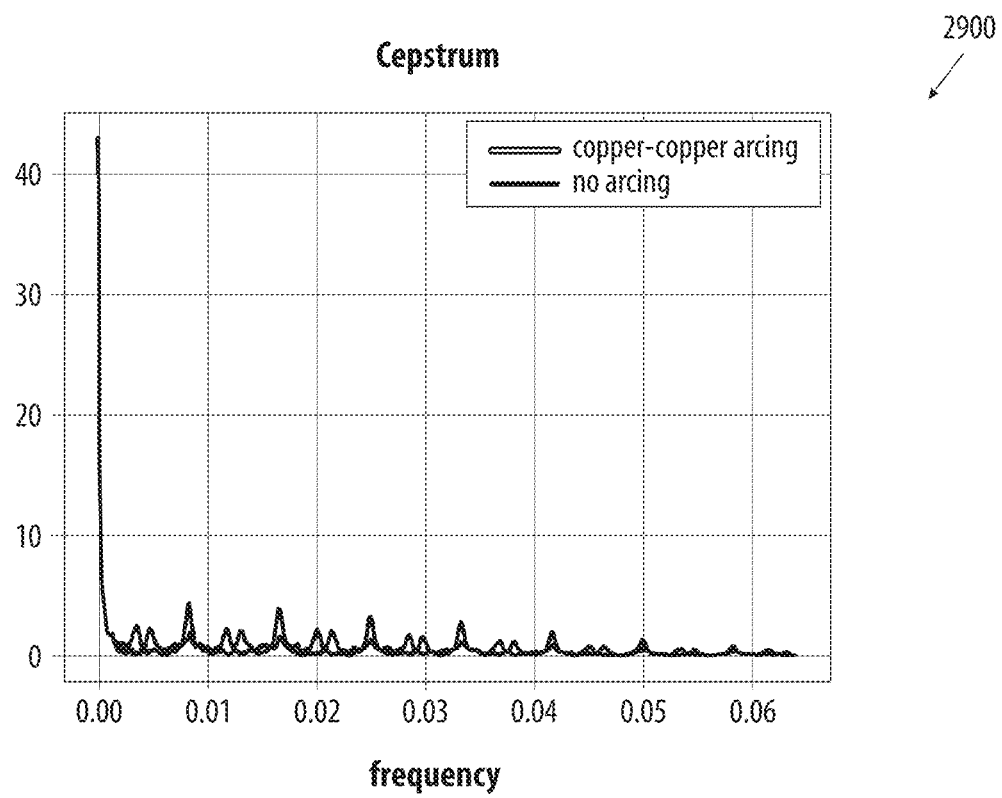
FIG. 29 illustrates a Cepstrum plot of an input current waveform.
Figure 30:
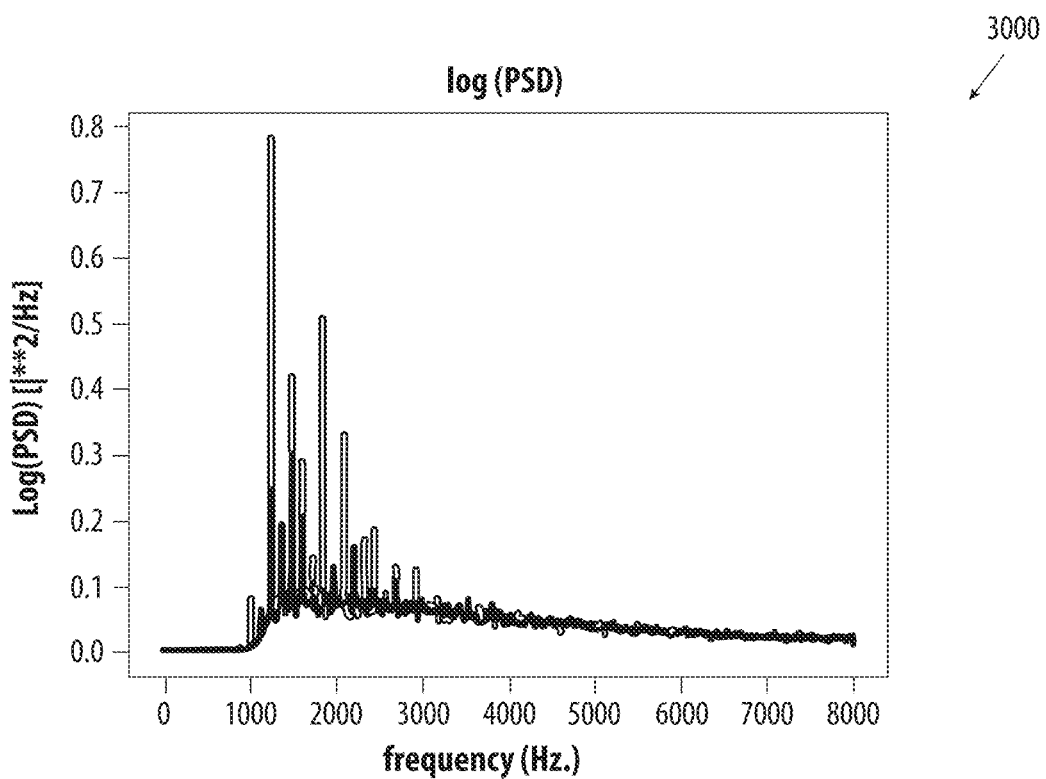
FIG. 30 illustrates a plot of a power spectral density of an example input current waveform.

The Cepstrum 2900 is a time domain function, however, the x-axis is not the same as the time axis. The x-axis is known as the quefrency-axis and is in units of time. The quefrency-axis may be explained in terms of 1/F where F is frequency from the PSD. Therefore, the time axis represents periodic signals in the PSD with decreasing frequency going to the left of the axis. The PSD frequency approaches infinity as the time value approaches zero. The Cepstrum 2900 may be used to capture the higher energy of the harmonics existing in an input current waveform 802. As can be seen in FIGS. 29 and 30, there is a noticeable visible difference in the magnitude of the odd harmonics at high frequencies.

In some embodiments, a magnetic 3D sensor may be used to detect series arc faults localized to a meter socket. The series arc fault may be viewed as a sort of spark gap transmitter. The spark from the electrical arc may initiate a strong EMF pulse that moves out radially from the location of the electrical arc. The EMF pulse should change the local magnetic field in such a way that it can be detected with a 3D magnetic sensor.

Figure 31:
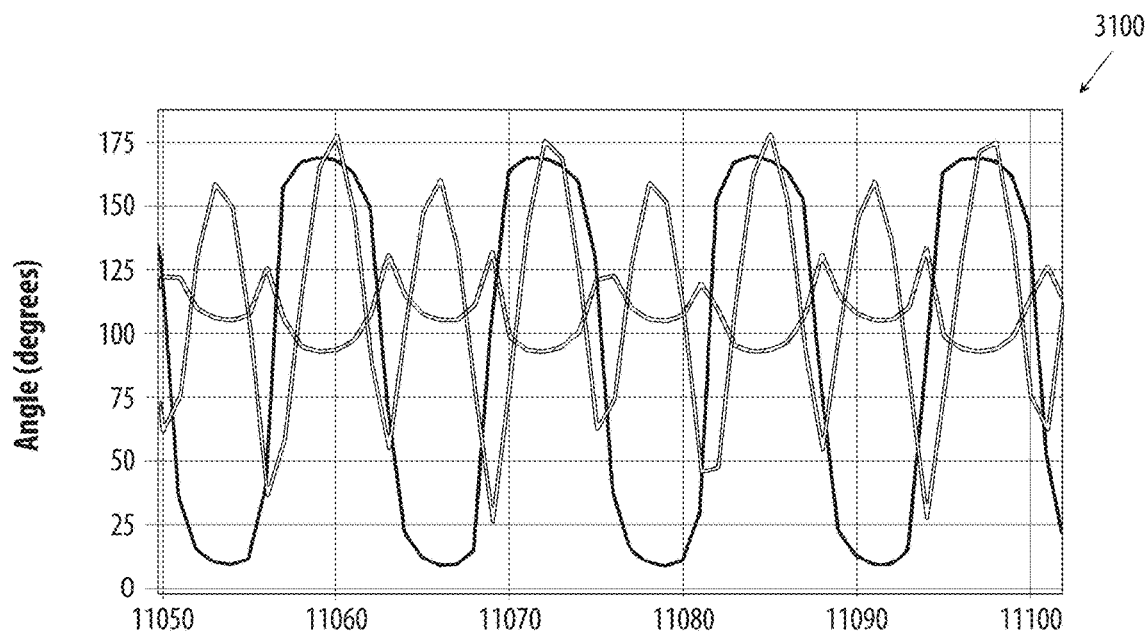
FIG. 31 illustrates a magnetic sensor output in response to a sensing an electrical arc in spherical coordinates.

During normal operation, the magnetic field generated from the current carrying conductor may surround the conductor with concentric rings perpendicular to the direction of current. Since this is an AC current, the magnetic field may switch directions over time. During testing, a magnetic 3D sensor was placed directly under the wire to test operation of the sensor. Testing results indicate that the sensor did detect the magnetic field near the conduction. FIG. 31 shows the magnetic sensor output 3100 in spherical coordinates.

Figure 32:
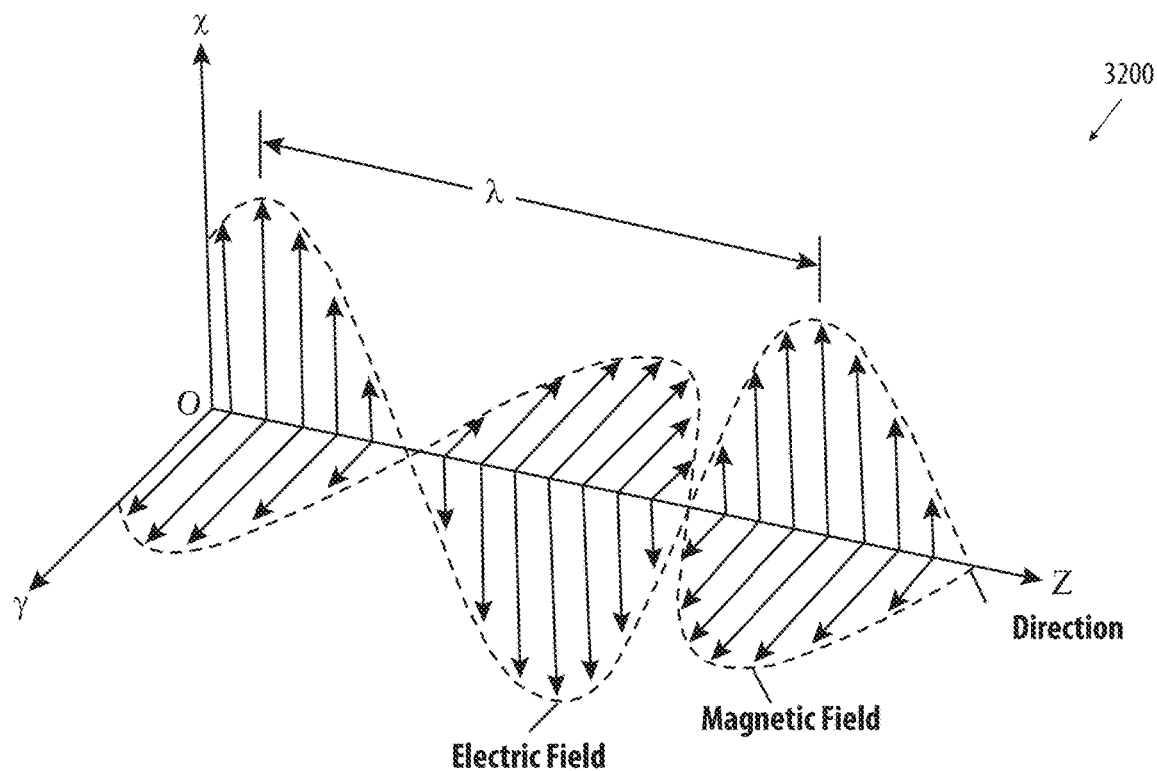
FIG. 32 illustrates a magnetic field for an EMF plane wave.

The magnetic field 3200 for an EMF plane wave is shown in FIG. 32. The E and H (magnetic) fields are perpendicular and perpendicular to the direction of travel. The dotted plot is the normalized magnetic field magnitude, the dashed plot is the angle in the XY plane and solid line plot is the angle in the Z plane. The vector direction is in either the positive or negative X direction. The orientation of the XY plane is generally random and is specified by the term polarization. The orientation of XY may be determined mostly by the transmitting antenna orientation. For a spark gap transmission this is a random XY orientation.

Figure 33:
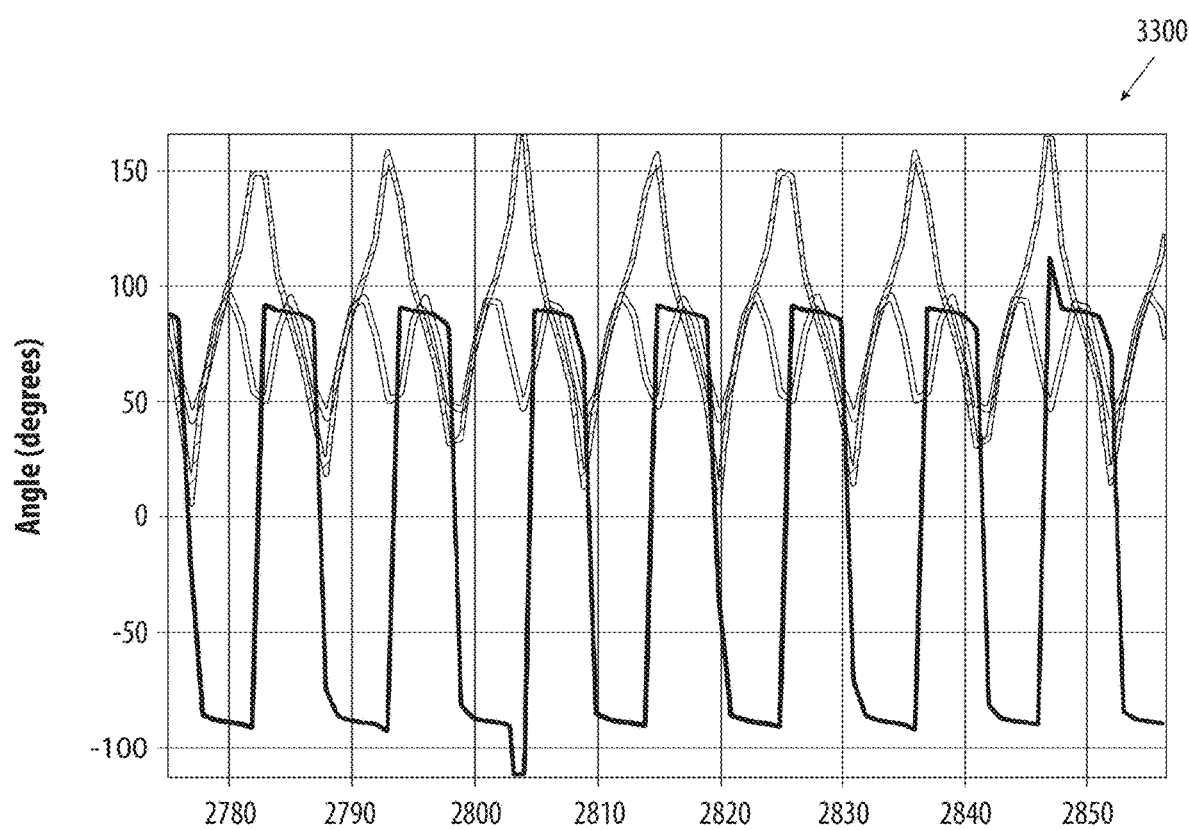
FIG. 33 illustrates another magnetic sensor output in response to a sensing an electrical arc in spherical coordinates.

The preliminary results 330 of testing are shown in FIG. 33 and indicate that some distortion in a sensed magnetic field and may be helpful in determining the occurrence of an arc fault.

In some embodiments, a Pearson Correlation Coefficient is computed for the input current waveform 802 on a cycle-by-cycle basis. The Pearson Correlation Coefficient provides a measure of correlation between adjacent 60 Hz. cycles. The Pearson Correlation Coefficient may be defined as:

$$r_k(n) = \frac{\sum_{j=1}^{M}[(x_{k-j} - \overline{x}_k)(x_{k-n-j} - \overline{x}_{k-n})]}{\sqrt{\left[\sum_{j=1}^{M}(x_{k-j} - \overline{x}_k)^2\right]}\sqrt{\left[\sum_{j=1}^{M}(x_{k-n-j} - \overline{x}_{k-n})^2\right]}}$$

Where r is a correlation efficient, $x_i$ is the values of the x-variable in the sample, $\overline{x}$ is the mean of the values of the x-variable, $y_i$ is the values of the y-variable in the sample, $\overline{y}$ is the mean of the values of the y-variable. The variable n, is a time shift in samples between the samples $x_{k-j}$ and $x_{k-n-j}$. An AC signal has a zero mean, so the equation can be simplified for analysis of an AC signal:

$$r_k(n) = \frac{\sum_{j=1}^{M}[(x_{k-j})(x_{k-n-j})]}{\sqrt{\left[\sum_{j=1}^{M}(x_{k-j})^2\right]}\sqrt{\left[\sum_{j=1}^{M}(x_{k-n-j})^2\right]}}$$

Computation can be simplified by only computing $r_k(n)$ for $n=T_0=f_s/f_0$ or the number of samples per cycle. For the case of a 16 khz sample frequency $n=n_0=266.66$ sample points. For a 60 Hz sinusoid, the correlation coefficient at n=1 period may be exactly 1.0. A basic hypothesis for using the inter-period correlation coefficient for socket integrity diagnosis assumes that the statistics of the line current through a single cycle are consistent in the absence of arcing, even if the load is non-linear, and that the arcing process may be represented by a non-stationary random process. For a non-arcing current signal, the correlation coefficient, $r_k(T_0)$, is likely to be near 1.0 and consistent across several cycles (low variance). In the presence of an arcing event, $r_k(T_0)$, is likely to be significantly smaller than 1.0 with more variability. When series arc faults occur, the arc signal levels are much smaller than the fundamental component and are therefore totally masked when computing the correlation on the raw signal. The deterministic part of the signal may be attenuated so that the resulting signal's $r_k(T_0)$ value is affected by arcing events. However, if the fundamental is totally removed, the $r_k(T_0)$ value in the non-arcing case may not maintain a value near 1.0. A basic candidate IIR filter may be suitable:

$$H(z) = (1-g)\frac{1 - 2Z^{-1} + Z^{-2}}{1 - (1-g)Z^{-1} + (1-g)^2 Z^{-2}}$$

Various features and advantages of the invention are set forth in the following claims.

The invention claimed is:

1. A series arc detection system configured to detect series arcs in an input current waveform comprising:
   a metering circuit configured to receive an input current waveform; and,
   a controller including a power monitoring module configured detect series arc currents input current waveform by:
      filtering the input current waveform to produce a filtered waveform;
      performing feature recognition on the filtered waveform;
      classifying one or more features of the filtered waveform identified during feature recognition;
      performing temporal processing on the filtered waveform;
      producing a score for the input current waveform based on the temporal processing of the filtered waveform; and,
      reporting the score to a user based on a comparison of the score to a programmable threshold.

2. The series arc detection system of claim 1, wherein performing feature recognition on the filtered waveform includes using a neural network to detect one or more features that may be indicative of arcing.

3. The series arc detection system of claim 2, wherein the neural network is a multi-layer perceptron.

4. The series arc detection system of claim 1, wherein performing feature recognition on the input current waveform includes using a maximum contiguous zeros function on the filtered waveform.

5. The series arc detection system of claim 1, wherein filtering the input current waveform includes inputting the input current waveform into a Gabor filter.

6. The series arc detection system of claim 1, wherein temporal processing of the filtered waveform includes integrating the filtered waveform and inputting the filtered waveform into a sigmoid function.

7. The series arc detection system of claim 1, wherein scoring the input current waveform includes scoring the input current waveform based on the temporal processing of the filtered waveform and one of a temperature of the metering circuit, a current time of day, an arc gap size, and an oxidation level of a connection between the metering circuit and a load.

8. A method of determining socket integrity comprising:
   receiving, via a metering circuit, an input current waveform; and,
   detecting, via a controller including a power monitoring module, series arc currents in the input current waveform by:
      filtering the input current waveform to produce a filtered waveform;
      performing feature recognition on the filtered waveform;
      classifying one or more features of the filtered waveform identified during feature recognition;
      performing temporal processing on the filtered waveform;
      producing a score for the input current waveform based on the temporal processing of the filtered waveform; and,
      reporting the score to a user based on a comparison of the score to a programmable threshold.

9. The method of claim 8, wherein performing feature recognition on the filtered waveform includes using a neural network to detect one or more features that may be indicative of arcing.

10. The method of claim 9, wherein the neural network is a multi-layer perceptron.

11. The method of claim 8, wherein performing feature recognition on the input current waveform includes using a maximum contiguous zeros function on the filtered waveform.

12. The method of claim 8, wherein filtering the input current waveform includes inputting the input current waveform into a Gabor filter.

13. The method of claim 8, wherein temporal processing of the filtered waveform includes integrating the filtered waveform and inputting the filtered waveform into a sigmoid function.

14. The method of claim 8, wherein scoring the input current waveform includes scoring the input current waveform based on the temporal processing of the filtered waveform and one of a temperature of the metering circuit, a current time of day, an arc gap size, and an oxidation level of a connection between the metering circuit and a load.

15. A meter in a power distribution network comprising:

a metering circuit in communication with at least one temperature sensor and configured to receive an input current waveform and determine a temperature value for the meter; and, a controller including a power monitoring module configured detect series arc currents input current waveform by:

filtering the input current waveform to produce filtered waveform;

using a root mean squared function on the input current waveform to produce an RMS value;

performing feature recognition on the filtered waveform;

classifying one or more features of the filtered waveform identified during feature recognition;

performing temporal processing on the filtered waveform;

producing a score for the input current waveform based on the temporal processing of the filtered waveform;

determining the temperature value for the meter;

using a fuzzy inference classifier to determine an alarm score based on the score for the input current waveform, the RMS value, and the temperature value for the meter; and, reporting the alarm score to a user based on a comparison of the score to a programmable threshold.

16. The method of claim 15, wherein performing feature recognition on the filtered waveform includes using a neural network to detect one or more features that may be indicative of arcing.

17. The method of claim 16, wherein the neural network is a multi-layer perceptron.

18. The method of claim 15, wherein performing feature recognition on the input current waveform includes using a maximum contiguous zeros function on the filtered waveform.

19. The method of claim 15, further comprising applying an alpha-beta filter to the temperature value to produce a temperature velocity.

20. The method of claim 19, wherein the alarm score is further based on the temperature velocity.

* * * * *

UNITED STATES PATENT AND TRADEMARK OFFICE
CERTIFICATE OF CORRECTION

| | | |
|---|---|---|
| PATENT NO. | : 12,248,034 B2 | Page 1 of 1 |
| APPLICATION NO. | : 18/137952 | |
| DATED | : March 11, 2025 | |
| INVENTOR(S) | : Scott David Brown et al. | |

It is certified that error appears in the above-identified patent and that said Letters Patent is hereby corrected as shown below:

In the Claims

Column 26, Line 19 Claim 16: Replace "method" with -- meter --.
Column 26, Line 23 Claim 17: Replace "method" with -- meter --.
Column 26, Line 25 Claim 18: Replace "method" with -- meter --.
Column 26, Line 29 Claim 19: Replace "method" with -- meter --.
Column 26, Line 32 Claim 20: Replace "method" with -- meter --.

Signed and Sealed this
Fifteenth Day of April, 2025

Coke Morgan Stewart
*Acting Director of the United States Patent and Trademark Office*